(12) United States Patent
Kitano et al.

(10) Patent No.: US 7,766,566 B2
(45) Date of Patent: Aug. 3, 2010

(54) DEVELOPING TREATMENT APPARATUS AND DEVELOPING TREATMENT METHOD

(75) Inventors: Takahiro Kitano, Koshi (JP); Masami Akimoto, Koshi (JP); Shuuichi Nishikido, Koshi (JP); Dai Kumagai, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 988 days.

(21) Appl. No.: 11/495,732

(22) Filed: Jul. 31, 2006

(65) Prior Publication Data

US 2007/0031145 A1 Feb. 8, 2007

(30) Foreign Application Priority Data

Aug. 3, 2005 (JP) .............................. 2005-225249
Aug. 10, 2005 (JP) .............................. 2005-232126

(51) Int. Cl.
G03D 5/04 (2006.01)
(52) U.S. Cl. ........................ 396/611; 396/604; 427/337; 118/56; 134/902
(58) Field of Classification Search .................. 396/611
See application file for complete search history.

(56) References Cited

U.S. PATENT DOCUMENTS

| | | | |
|---|---|---|---|
| 4,215,927 A * | 8/1980 | Grant et al. .................. 396/611 |
| 5,919,520 A | 7/1999 | Tateyama et al. |
| 6,062,288 A | 5/2000 | Tateyama |
| 6,318,948 B1 | 11/2001 | Ueda et al. |
| 6,419,408 B1 | 7/2002 | Inada |
| 6,709,174 B2 | 3/2004 | Yamamoto et al. |
| 6,874,515 B2 * | 4/2005 | Ishihara et al. .............. 134/140 |
| 6,955,485 B2 * | 10/2005 | Ono et al. .................... 396/611 |
| 7,323,060 B2 * | 1/2008 | Yamada et al. .............. 118/500 |
| 7,591,601 B2 * | 9/2009 | Matsuoka et al. ........... 396/611 |
| 7,651,284 B2 * | 1/2010 | Kitamura .................... 396/611 |
| 2006/0011222 A1 * | 1/2006 | Lee ............................. 134/61 |
| 2007/0275178 A1 * | 11/2007 | Nishi et al. .............. 427/430.1 |
| 2008/0267619 A1 * | 10/2008 | Matsuoka .................... 396/611 |
| 2008/0314870 A1 * | 12/2008 | Inoue et al. ................... 216/38 |

FOREIGN PATENT DOCUMENTS

JP 2001-87721 4/2001

* cited by examiner

*Primary Examiner*—Melissa J Koval
*Assistant Examiner*—Bret Adams
(74) *Attorney, Agent, or Firm*—Oblon, Spivak, McClelland, Maier & Neustadt, L.L.P.

(57) ABSTRACT

In the present invention, a substrate transfer unit into/from which a substrate is transferred from/to the outside of a treatment container and a developing treatment unit in which development of the substrate is performed are arranged side by side in the treatment container, and a carrier mechanism is provided which carries the substrate while grasping an outside surface of the substrate from both sides, between the substrate transfer unit and the developing treatment unit. A developing solution supply nozzle for supplying a developing solution onto the substrate and a gas blow nozzle for blowing a gas to the substrate, are provided between the substrate transfer unit and the developing treatment unit and above a carriage path along which the substrate is carried, and a cleaning solution supply nozzle is provided in the developing treatment unit for supplying a cleaning solution onto the substrate. According to the present invention, since the substrate is carried with its outside surface being grasped, spread of contamination can be prevented to restrain generation of particles in the treatment container.

28 Claims, 17 Drawing Sheets

DEVELOPING TREATMENT APPARATUS AND DEVELOPING TREATMENT METHOD

BACKGROUND OF THE INVENTION

1. Field of the Invention

The present invention relates to a substrate developing treatment apparatus and a developing treatment method.

2. Description of the Related Art

In a photolithography process, for example, in a manufacturing process of a semiconductor device, a developing treatment of developing, for example, a wafer exposed to light under a predetermined pattern is performed. The developing treatment is generally performed in a developing treatment apparatus in such a manner that, for example, a wafer is rotated by a spin chuck, a developing solution is supplied onto the wafer from a developing solution supply nozzle to form a liquid film on the front surface of the wafer to thereby perform development of the wafer in the developing treatment.

In the above-described developing treatment apparatus, however, it is necessary to rotate the wafer and thus to use a rotation motor with a high torque for the spin chuck. Therefore, a large space is required for the motor, leading to a larger developing treatment apparatus. Further, a large power consumption is required for rotation of the motor, resulting in increased running cost.

Hence, it can be proposed to use a so-called spin-less developing treatment apparatus in which the wafer is not rotated. Presently, it is proposed that a roller-type conveyer using a plurality of rollers is used to carry the wafer to pass the wafer under the developing solution supply nozzle in order to develop the wafer (Japanese Patent Application Laid-open No. 2001-87721).

In the case of the developing treatment apparatus in which the wafer is carried by the roller-type carriage and developed, however, the rollers come into contact with the lower surface of the wafer contaminated with, for example, the developing solution. Therefore, the rollers are contaminated, and the contaminant adheres to other portions of the wafer or to other wafers and accordingly diffuses, thus spreading the particle source. This causes a large amount of particles and contaminates the wafer, for example, before it is developed, resulting in development defects.

Besides, as the developing treatment apparatus, a kind of developing treatment apparatus is used in which the developing solution supply nozzle moves along the front surface of the wafer while discharging the developing solution to supply the developing solution onto the entire front surface of the wafer.

However, in this kind of developing treatment apparatus, the developing solution supply nozzle supplies the developing solution while moving, with the result that the developing solution tends to flow and wave on the wafer. Therefore, the developing solution on the wafer might not become stable to cause unstable development. To solve this problem, it is proposed to hold, for example, a porous plate between the developing solution supply nozzle and the wafer and supply the developing solution onto the wafer through the porous plate so that the developing solution is sandwiched between the porous plate and the wafer (Japanese Patent Application Laid-open No. 2005-51008).

However, even with this technique, for example, the developing solution has a speed component in a predetermined direction at the time of supplying the developing solution, causing "shear resistance" at the interface between the porous plate and the developing solution. This shear resistance causes the developing solution on the wafer to wave to cause convection in the developing solution. When the convection occurs in the developing solution, the concentration of the developing solution on the wafer may vary, leading to non-uniform development. Further, the residual of the developing solution adheres to the pattern on the front surface of the wafer to cause a development defect at that portion.

SUMMARY OF THE INVENTION

The present invention has been developed in consideration of the above viewpoints, and the first object of the present invention is to restrain generation of particles in a developing treatment apparatus of a type in which a substrate is not rotated. Further, the second object of the present invention is to restrain convection of the developing solution on the substrate to stabilize the development within the substrate so as to improve the uniformity of the development in a developing treatment apparatus in which a developing solution supply nozzle and the substrate such as a wafer are moved relative to each other to supply the developing solution on the substrate.

The present invention to achieve the first object is a substrate developing treatment apparatus including: a substrate transfer unit into/from which a substrate is transferred from/to the outside of a treatment container and a developing treatment unit in which development of the substrate is performed, the substrate transfer unit and the developing treatment unit being arranged side by side in the treatment container; a carrier mechanism provided in the treatment container for carrying the substrate while grasping an outside surface of the substrate from both sides, between the substrate transfer unit and the developing treatment unit; a developing solution supply nozzle for supplying a developing solution onto the substrate and a gas blow nozzle for blowing a gas to the substrate, the developing solution supply nozzle and the gas blow nozzle being provided between the substrate transfer unit and the developing treatment unit and above a carriage path along which the substrate is carried by the carrier mechanism; and a cleaning solution supply nozzle provided in the developing treatment unit for supplying a cleaning solution onto the substrate.

The present invention according to another aspect is a substrate developing treatment apparatus including: a substrate transfer unit into/from which a substrate is transferred from/to the outside of a treatment container and a developing treatment unit in which development of the substrate is performed, the substrate transfer unit and the developing treatment unit being arranged side by side in the treatment container; a carrier mechanism provided in the treatment container for carrying the substrate while grasping an outside surface of the substrate from both sides, between the substrate transfer unit and the developing treatment unit; and a developing solution supply nozzle for supplying a developing solution onto the substrate, a cleaning solution supply nozzle for supplying a cleaning solution onto the substrate, and a gas blow nozzle for blowing a gas to the substrate, the developing solution supply nozzle, the cleaning solution supply nozzle, and the gas blow nozzle being provided between the substrate transfer unit and the developing treatment unit and above a carriage path of the substrate carried by the carrier mechanism.

According to still another aspect, the present invention is a developing treatment method of performing developing treatment for a substrate using the previously described developing treatment apparatus, including the steps of: grasping the outside surface of the substrate in the substrate transfer unit by the carrier mechanism; carrying the substrate in the substrate transfer unit by the carrier mechanism to the developing treatment unit while discharging the developing solution from the developing solution supply nozzle to form a liquid film of the developing solution on the substrate; performing static development for the substrate in the developing treatment unit; reciprocating the substrate by the carrier mechanism between the developing treatment unit and the substrate transfer unit while discharging the cleaning solution from the cleaning solution supply nozzle to form a liquid film of the cleaning solution on the substrate; and carrying the substrate in the developing treatment unit by the carrier mechanism to the substrate transfer unit while blowing the gas from the gas blow nozzle to remove the cleaning solution on the substrate.

According to the present invention, since the substrate is carried with its outside surface being grasped, spread of contamination as in the prior art can be prevented to restrain generation of particles in the treatment container. As a result, development defects of the substrate treated by the developing treatment apparatus can be decreased. Consequently, according to the present invention, a spin-less developing treatment apparatus can be realized to significantly reduce the size of the developing treatment apparatus, and appropriate development free from development defects can be performed to improve yields.

The present invention to achieve the second object is a developing treatment apparatus including a developing solution supply nozzle disposed above a substrate in which the developing solution supply nozzle and the substrate are relatively horizontally moved while the developing solution supply nozzle is discharging a developing solution to supply the developing solution to the substrate, the apparatus including: a mesh plate capable of lying between the developing solution supply nozzle and the substrate and allowing the developing solution to pass therethrough, wherein the mesh plate is capable of approaching the substrate such that the mesh plate comes into contact with the developing solution supplied on the substrate, and wherein at least a surface of the mesh plate on the substrate side has been subjected to hydrophilic treatment.

According to the present invention, since at least the surface of the mesh plate on the substrate side has been subjected to hydrophilic treatment, even if the developing solution is supplied from the developing solution supply nozzle onto the substrate through the mesh plate while the developing solution supply nozzle and the substrate are moving relative to each other so that the developing solution is held between the mesh plate and the substrate, the shear resistance works between the developing solution on the substrate and the mesh plate can be reduced. As a result, wave of the developing solution on the substrate is restrained, so that the developing solution on the substrate becomes stable to allow the development to be appropriately performed within the substrate.

According to the present invention, convection in the developing solution supplied on the substrate can be restrained to stabilize the developing solution on the substrate, so that the substrate can be uniformly developed without unevenness, resulting in improved yields.

DETAILED DESCRIPTION OF THE PREFERRED EMBODIMENT

Figure 1:
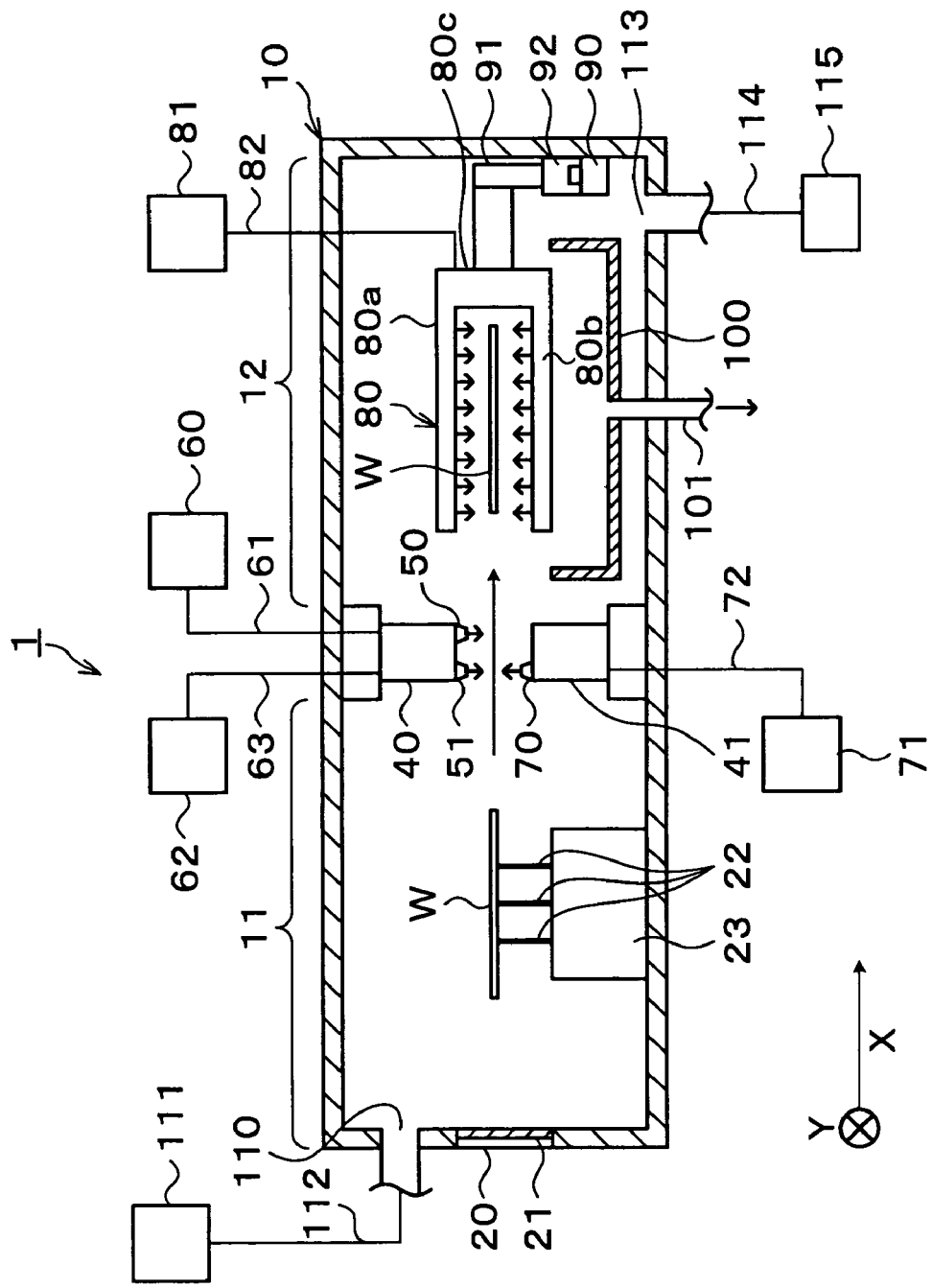
FIG. 1 is an explanatory view of a longitudinal section showing the outline of a configuration of a developing treatment apparatus according to this embodiment.
Figure 2:
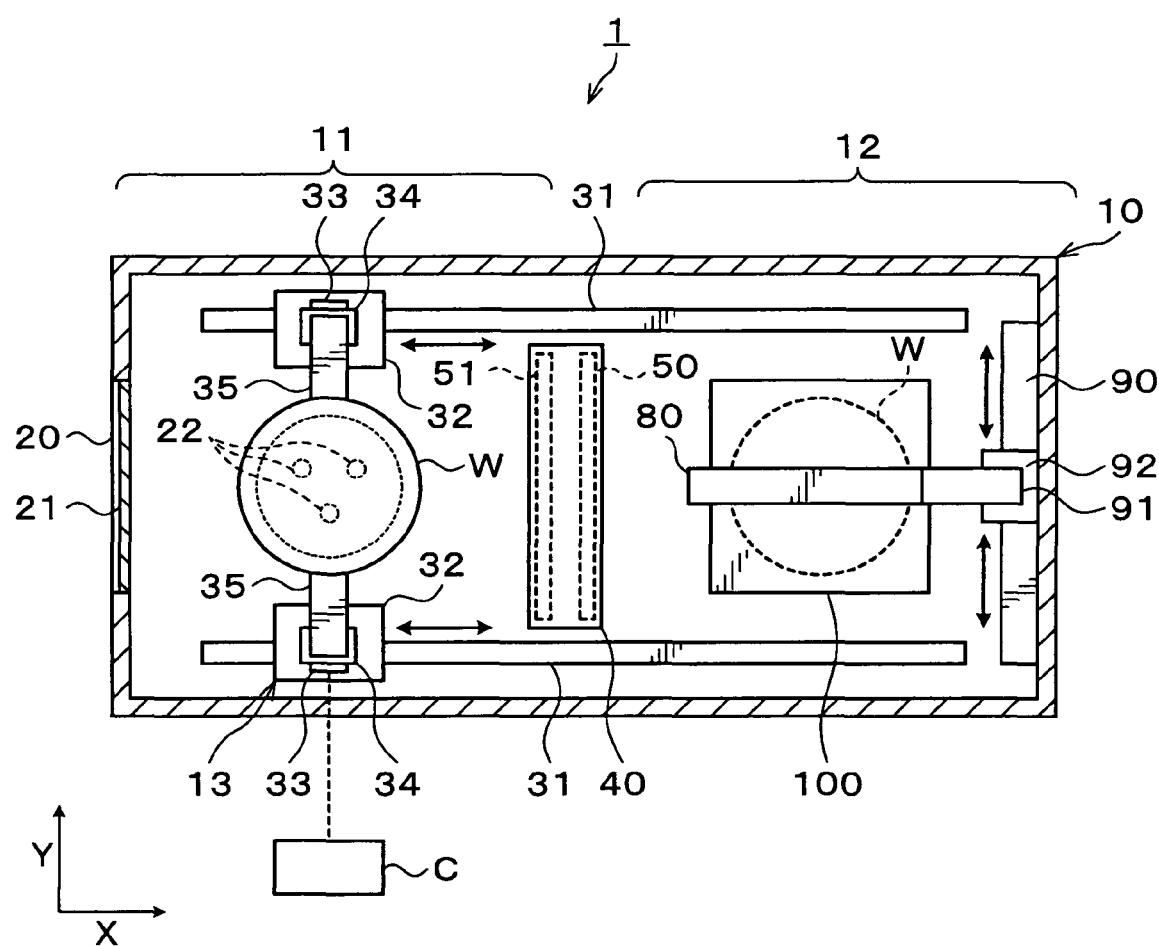
FIG. 2 is an explanatory view of a transverse section showing the outline of the configuration of the developing treatment apparatus.

Hereinafter, preferred embodiments of the present invention will be described. FIG. 1 is an explanatory view of a longitudinal section showing the outline of a configuration of a developing treatment apparatus 1 according to this embodiment. FIG. 2 is an explanatory view of a transverse section showing the outline of the configuration of the developing treatment apparatus 1.

The developing treatment apparatus 1 includes, for example, a closable treatment container 10 as shown in FIG. 1. The treatment container 10 has an outside shape formed in an almost rectangular parallelepiped shape elongated in an X-direction (a left-to-right direction in FIG. 1). In the treatment container 10, a transfer unit 11 for transferring a wafer W to/from the outside and a developing treatment unit 12 for performing developing treatment for the wafer W are provided which are arrange side by side in the X-direction. Further, in the treatment container 10, a carrier mechanism 13 is provided which carries the wafer W while grasping the outside surface of the wafer W, between the transfer unit 11 and the developing treatment unit 12 as shown in FIG. 2.

As shown in FIG. 1, a carrier port 20 for carrying-in/out the wafer W from/to the outside of the treatment container 10 is provided in a side wall surface, for example, on the side of a negative direction (the left direction in FIG. 1) in the X-direction of the treatment container 10. A shutter 21 is provided at the carrier port 20 and can cut off the atmosphere in the treatment container 10 from the outside.

In the transfer unit 11, a plurality of support pins 22 are provided as support members for horizontally supporting the wafer W. The support pins 22 can rise and lower in the vertical direction, for example, by means of a rising and lowering drive unit 23 such as a cylinder to support the wafer W at a predetermined height.

Figure 3:
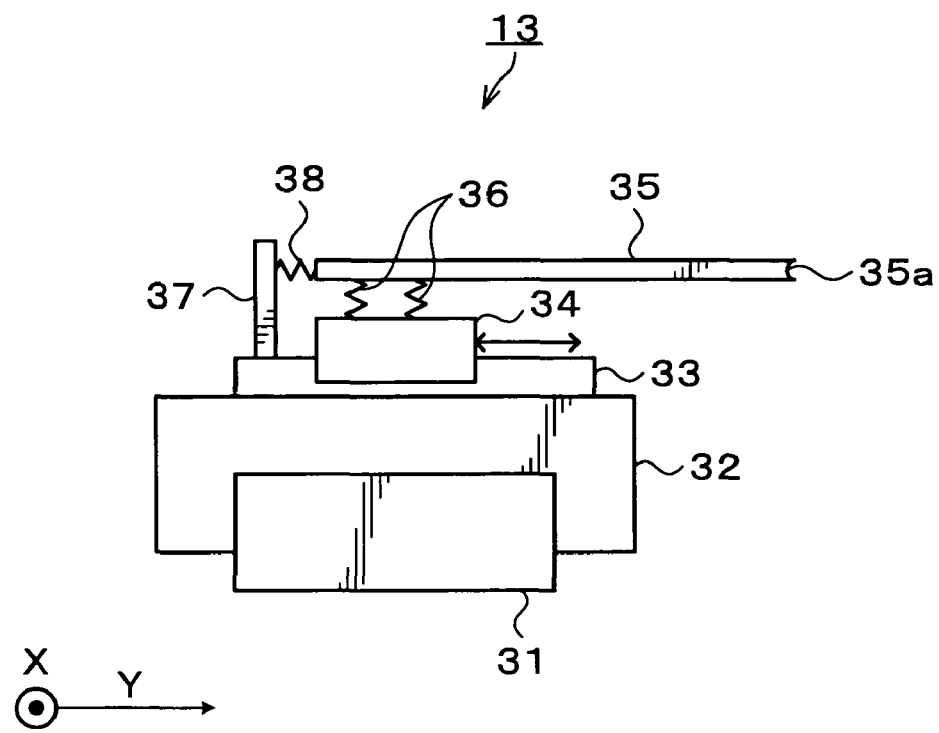
FIG. 3 is a side view showing the outline of the configuration of a carrier mechanism.

As shown in FIG. 2, first guide rails 31 extending in the X-direction from the transfer unit 11 to the developing treatment unit 12 are provided respectively near both ends in a Y-direction (a top-to-bottom direction) in the treatment container 10. On the first guide rail 31, a first slider 32 being a guide unit moving on the rail 31 as shown in FIG. 2 and FIG. 3. The first slider 32 includes a drive source such as a motor and can move in the X-direction along the rail 31. On the first slider 32, a second guide rail 33 is formed which extends in the Y-direction as shown in FIG. 3. The second guide rail 33 is provided with a second slider 34 as a moving member. The second slider 34 includes a drive source such as a motor and can move in the Y-direction along the second guide rail 33.

To the top of the second slider 34, a grasping arm 35 as a grasping member for grasping the outside surface of the wafer W is attached. The grasping arm 35 is formed in the shape of a plate having a thickness at least larger than the thickness of the wafer W, and formed in an almost rectangle elongated starting from a position over the second slider 34 to the center in the Y-direction of the treatment container 10 as shown in FIG. 2.

Figure 4:
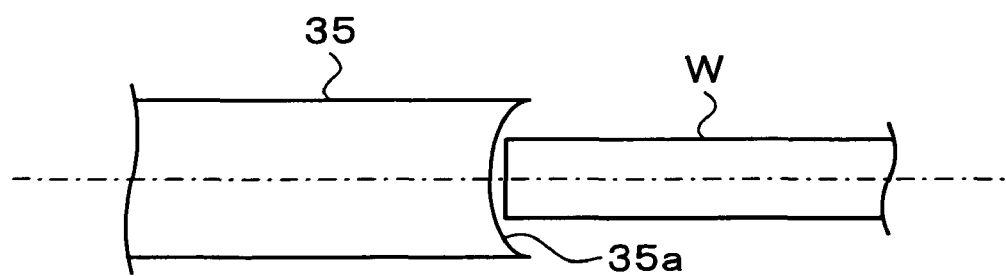
FIG. 4 is a side view of a tip of a grasping arm.

As shown in FIG. 4, a tip surface 35a of the grasping arm 35 which comes into contact with the wafer W is curved concavely inward from a lateral view. Even if the height of the wafer W is slightly different from the height of the grasping arm 35 when the tip surface 35a of the grasping arm 35 comes into contact with the outside surface of the wafer W, the concave of the tip surface 35a can guide the wafer W to the center in the thickness direction of the grasping arm 35. Note that the shape of the tip surface 35a may be concave in the shape of a triangle inward from a lateral view.

The tip surface 35a of the grasping arm 35 is formed in a curved shape conforming to the shape of the outside surface of the wafer W from a lateral view as shown in FIG. 2. The tip surface 35a is formed such that it has a radius of curvature slightly larger than that of the wafer W. This ensures that even when the grasping arm 35 is misaligned from the wafer W in the X-direction, the curve of the tip surface 35a can guide the wafer W to the center in the width direction of the grasping arm 35 (the X-direction).

As shown in FIG. 3, a plurality of springs 36 as elastic bodies standing in the vertical direction lie between the second slider 34 and the grasping arm 35. The springs 36 can absorb an impact when the grasping arm 35 grasps the wafer W.

On the second slider 34 on the rear side of the grasping arm 35, a fixed member 37 in a plate shape is provided standing in the vertical direction. The rear surface of the grasping arm 35 and the fixed member 37 are connected via a spring 38 as an elastic body directed in the Y-direction. The spring 38 can keep the contact pressure when the grasping arm 35 grasps the wafer W.

In this embodiment, the carrier mechanism 13 is composed of the above-described first guide rails 31, the first sliders 32, the second guide rails 33, the second sliders 34, the grasping arms 35, the springs 36, the fixed members 37 and the springs 38. The carrier mechanism 13 can move the grasping arms 35 in the Y-direction using the second sliders 34, grasp the wafer W mounted on the support pins 22 from both sides, and move the grasping arms 35 in the X-direction using the first sliders 32 keeping that holding state. Thus, the carrier mechanism 13 can move the wafer W in the horizontal direction between the transfer unit 11 and the developing treatment unit 12 while grasping the outside surface of the wafer W. Note that the operation of the carrier mechanism 13 is controlled by the control unit C of the developing treatment apparatus 1 shown in FIG. 2.

Between the transfer unit 11 and the developing treatment unit 12 in the treatment container 10, two nozzle holding units 40 and 41 are provided as shown in FIG. 1. The nozzle holding units 40 and 41 are arranged on a ceiling surface and a bottom surface respectively in a manner to vertically face each. The nozzle holding units 40 and 41 are arranged to hold a carriage path of the wafer W by the carrier mechanism 13 therebetween.

Figure 5:
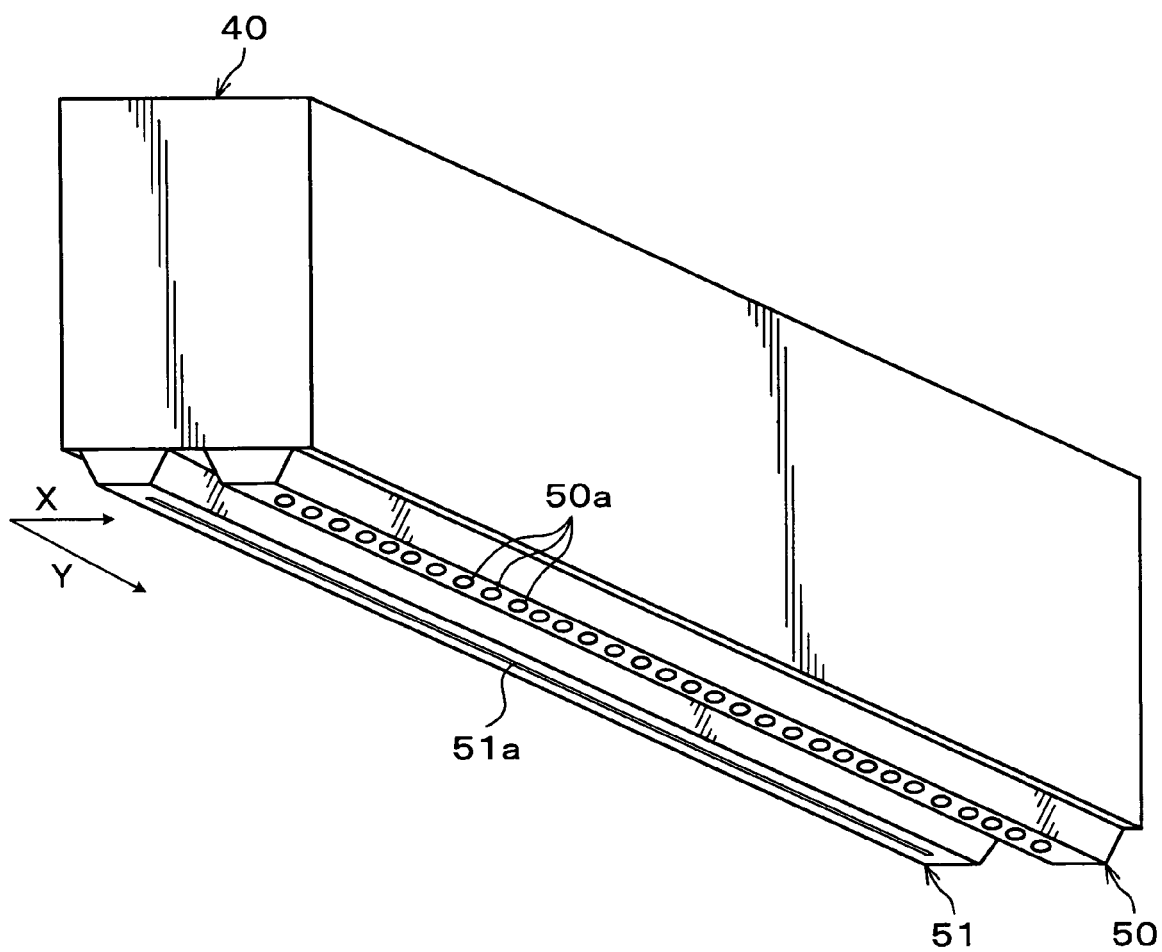
FIG. 5 is a perspective view showing the outline of a configuration of a nozzle holding unit.

The nozzle holding units 40 and 41 are formed in the Y-direction as shown in FIG. 5, for example, in an almost rectangular parallelepiped shape at least longer than the diameter of the wafer W. The nozzle holding units 40 and 41 are formed between the two first guide rails 31 on both sides in the Y-direction of the treatment container 10 in plan view as shown in FIG. 2, so that the nozzle holding units 40 and 41 substantially separate the atmospheres in the transfer unit 11 and the developing treatment unit 12.

The nozzle holding unit 40 is, for example, attached to the ceiling surface of the treatment container 10 as shown in FIG. 1. The lower end surface of the nozzle holding unit 40 is horizontally formed and provided with a developing solution supply nozzle 50 and an air blow-out nozzle 51 as a gas blow nozzle and an air supply unit, which are arranged side by side in the X-direction. For example, the developing solution supply nozzle 50 is disposed on the developing treatment unit 12 side and the air blow-out nozzle 51 is disposed on the transfer unit 11 side.

The developing solution supply nozzle 50 is formed across the nozzle holding unit 40 in its longitudinal direction (the Y-direction) as shown in FIG. 5. The developing solution supply nozzle 50 is formed with a plurality of discharge ports 50a in the shape of circular holes arranged side by side in a line along the longitudinal direction.

To the nozzle holding unit 40, for example, a developing solution supply pipe 61 is connected which communicates with a developing solution supply source 60 as shown in FIG. 1. Inside the nozzle holding unit 40, a flow path is formed through which the developing solution flows, so that the developing solution supplied into the nozzle holding unit 40 through the developing solution supply pipe 61 can be discharged from the discharge ports 50a of the developing solution supply nozzle 50. The developing solution is discharged from the developing solution supply nozzle 50 onto the wafer W while the wafer W passes under the nozzle holding unit 40 in the X-direction, whereby the developing solution can be supplied onto the front surface of the wafer W.

The air blow-out nozzle 51 is formed across the nozzle holding unit 40 in its longitudinal direction as shown in FIG. 5. The air blow-out nozzle 51 is formed with a blow-out port 51a in a slit shape along the longitudinal direction. To the nozzle holding unit 40, for example, an air supply pipe 63 is connected which communicates with an air supply source 62 as shown in FIG. 1. Inside the nozzle holding unit 40, a gas path is formed through which air passes. The air supplied into the nozzle holding unit 40 through the air supply pipe 63 is jetted out from the blow-out port 51a of the air blow-out nozzle 51. The air is blown out from the air blow-out supply nozzle 51 onto the wafer W passing under the nozzle holding unit 40 in the X-direction to form an "air knife" which can remove the liquid on the wafer W to dry the wafer W. Note that the air supply source 62 is provided with an adjusting mechanism for adjusting the supply amount of air which can be controlled, for example, by the control unit C to arbitrarily adjust the amount of air blown out from the air blow-out nozzle 51.

The nozzle holding unit 41 is attached to the bottom surface of the treatment container 10. The upper end surface of the nozzle holding unit 41 is horizontally formed and provided with an air blow-out nozzle 70. The air blow-out nozzle 70 is disposed to face the above-described air blow-out nozzle 51 of the nozzle holding unit 40. The air blow-out nozzle 70 has the same configuration as that of the air blow-out nozzle 51 and can jet air, which is supplied from an air supply source 71 through an air supply pipe 72, from a blow-out port of the air blow-out nozzle 70. The air is blown out from the air blow-out supply nozzle 70 to the wafer W passing above the nozzle holding unit 41 to form an "air knife" which can remove the liquid on the lower surface of the wafer W. Further, air is blown to the wafer W from above and below, the pressures applied to the upper and lower surfaces of the wafer W can be maintained at the same degree. This can prevent the wafer W from slipping off from the grasping arms 35 to fall down even when air is blown at a high pressure to the upper surface of the wafer W from above in order to remove the liquid on the upper surface of the wafer W.

Figure 6:
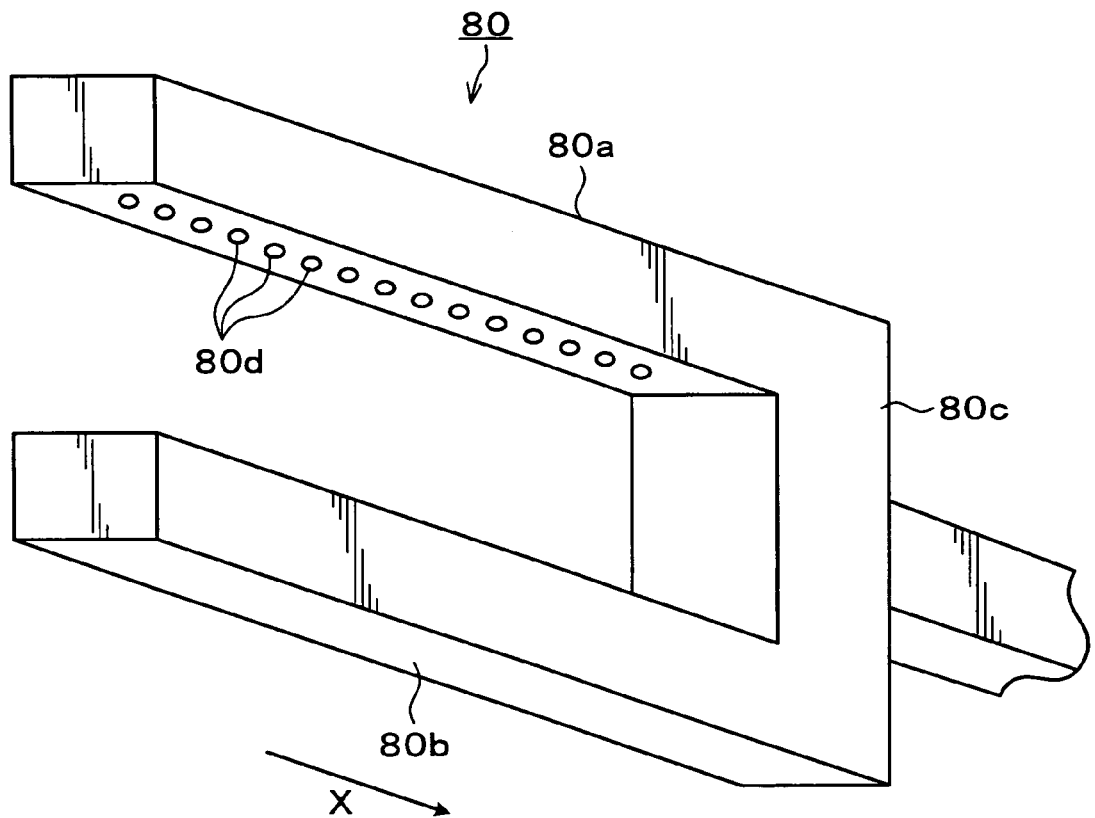
FIG. 6 is a perspective view showing the outline of a configuration of a cleaning solution supply nozzle.

In the developing treatment unit 12, a cleaning solution supply nozzle 80 is disposed. The cleaning solution supply nozzle 80 is formed in an almost U-shape with an opening on the negative direction side in the X-direction. More specifically, as shown in FIG. 1 and FIG. 6, the cleaning solution supply nozzle 80 is composed of an elongated upper nozzle 80a along the X-direction located above the wafer W, an elongated lower nozzle 80b along the X-direction located below the wafer W, and a vertical connecting portion 80c located beside the wafer W on the positive direction side in the X-direction for connecting an end portion of the upper nozzle 80a and an end portion of the lower nozzle 80b.

The upper nozzle 80a is formed, for example, longer than the diameter of the wafer W as shown in FIG. 1. The lower surface of the upper nozzle 80a is formed with a plurality of discharge ports 80d arranged side by side in a line along the longitudinal direction as shown in FIG. 6. The lower nozzle 80b is disposed facing the upper nozzle 80a. The lower nozzle 80b is formed, similarly to the upper nozzle 80a, longer than the diameter of the wafer W, and the upper surface of lower nozzle 80b is formed with a plurality of discharge ports 80d. To the cleaning solution supply nozzle 80, for example, a cleaning solution supply pipe 82 is connected which communicates with a cleaning solution supply source 81 as shown in FIG. 1. Inside the cleaning solution supply nozzle 80, a not-shown flow path for the cleaning solution is formed so that the cleaning solution supplied into the cleaning solution supply nozzle 80 through the cleaning solution supply pipe 82 is discharged from the discharge ports 80d of the upper nozzle 80a and the lower nozzle 80b.

On the side wall surface of the treatment container 10 on the positive direction side in the X-direction, a rail 90 is formed which extends in the Y-direction as shown in FIG. 1 and FIG. 2. For example, the vertical connecting portion 80c of the cleaning solution supply nozzle 80 is held by a nozzle arm 91. The nozzle arm 91 can move in the Y-direction on the rail 90 by means of a drive source 92 such as a motor. The cleaning solution supply nozzle 80 discharges the cleaning solution from the upper and lower discharge ports 80d with the wafer W held therebetween, and moves in the Y-direction from one end portion to the other end portion of the wafer W, whereby the cleaning solution supply nozzle 80 can supply the cleaning solution to the upper surface and the lower surface of the wafer W.

At a lower portion of the developing treatment unit 12, a catch container 100 is provide which catches and collects the liquid dropping from the cleaning solution supply nozzle 80 and the wafer W. To the catch container 100, a drain pipe 101 is connected which leads to the outside of the treatment container 10 as shown in FIG. 1.

On the side wall surface of the treatment container 10 on the negative direction side in the X-direction, an air supply port 110 is formed which supplies clean air. To the air supply port 110, for example, an air supply pipe 112 is connected which leads to an air supply source 111. An exhaust port 113 is formed in the bottom surface of the treatment container 10 near the end portion on the positive direction side in the X-direction. The exhaust port 113 is connected to a negative pressure generating device 115, for example, via an exhaust pipe 114. The negative pressure generating device 115 can be used to exhaust the atmosphere in the treatment container 10 from the exhaust port 113. The clean air is supplied from the air supply port 110 and the atmosphere is exhausted from the exhaust port 113, whereby airflow can be made which flows from the transfer unit 11 to the developing treatment unit 12 in the treatment container 10.

Note that the driving of the cleaning solution supply nozzle 80, the start/stop of discharge or jet from the nozzles 50, 51, 80 and 70, and the start/stop of the air supply from the air supply port 110 and the exhaust of air from the exhaust port 113 are controlled by the control unit C.

Next, a developing process performed in the developing treatment apparatus 1 configured as described above will be described.

For example, during the developing treatment, the air supply from the air supply port 110 and the exhaust of air from the exhaust port 113 are performed at all times, so that airflow of clean air is formed in the treatment container 10 which flows from the transfer unit 11 to the developing treatment unit 12. Further, air is blown out, for example, from the air blow-out nozzle 51 to form an air curtain between the nozzle holding units 40 and 41.

Then, the wafer W is first carried by an external carrier arm into the transfer unit 11 through the carrier port 20 and supported on the support pins 22 as shown in FIG. 1. After the wafer W is supported on the support pins 22, the grasping arms 35 waiting on both sides in the Y-direction move toward the wafer W so that the grasping arms 35 grasp the outside surface of the wafer W on both sides in the Y-direction as shown in FIG. 2. The wafer W is then horizontally moved by the grasping arms 35 in the positive direction in the X-direction on the developing treatment unit 12 side. Immediately before the wafer W passes between the nozzle holding units 40 and 41, the developing solution starts to be discharged from the developing solution supply nozzle 50, and the wafer W passes under the developing solution supply nozzle 50 discharging the developing solution. In other words, the developing solution supply nozzle 50 discharging the developing solution moves relative to the wafer W from one end portion to the other end portion of the wafer W. This forms a liquid film of the developing solution on the front surface of the wafer W. The supply of the developing solution starts development of the wafer W.

The wafer W is moved, for example, to the central portion of the developing treatment unit 12 and stopped there. Then, the wafer W held by the grasping arms 35, is subjected to static development for a predetermined period. After a lapse of the predetermined period, the cleaning solution supply nozzle 80 moves in the Y-direction from one end portion side to the other end portion side of the wafer W while discharging the cleaning solution. For example, the cleaning solution supply nozzle 80 reciprocates a plurality of times between both the end portions of the wafer W. This replaces the developing solution on the front surface of the wafer W with the cleaning solution so that a liquid film (a heap) of the cleaning solution is formed on the wafer W. The supply of the cleaning solution stops the development of the wafer W.

Figure 7:
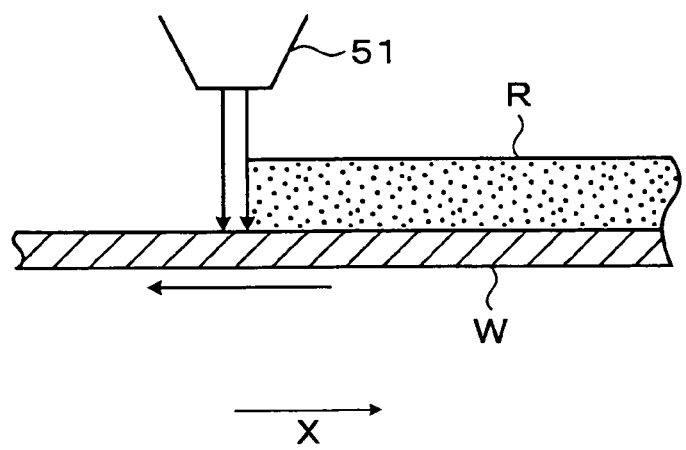
FIG. 7 is an explanatory view showing an appearance in which a cleaning solution is removed from a wafer.

After formation of the heap of the cleaning solution on the front surface of the wafer W, the wafer W is then moved by the grasping arms 35 in the negative direction in the X-direction on the transfer unit 11 side. Immediately before the wafer W passes between the nozzle holding units 40 and 41, air is jetted from the air blow-out nozzle 70 on the lower side. Further, the flow rate of air jetted from the air blow-out nozzle 51 on the upper side is increased. The wafer W passes through the position where the air is blown out from above and below, whereby the heap of the cleaning solution on the front surface of the wafer W and the liquid adhering to the rear surface of the wafer W are removed. In this event, the air from the air blow-out nozzle 51 serves as the air knife as shown in FIG. 7 such that the pressure of the air removes a cleaning solution R on the front surface of the wafer W at once from one end portion toward the other end portion of the wafer W to dry the wafer W. Note that arrangement of the air blow-out nozzle 51 such that it blows air even slightly toward the developing treatment unit 12 side can prevent mist from scattering into the transfer unit 11. This also applies to the air blow-out nozzle 70.

When moved to a position above the support pins 22 in the transfer unit 11, the wafer W is stopped and transferred from the grasping arms 35 onto the support pins 22 and supported on them. Thereafter, the wafer W is carried out by the external carrier arm via the carrier port 20, whereby a series of processes of the developing treatment is finished. Note that the series of processes of the developing treatment is realized by the control unit C, for example, controlling the driving of the carrier mechanism 13 and the cleaning solution supply nozzle 80, the start/stop of discharge or jet from the nozzles, and start/stop of the air supply from the air supply port 110 and the exhaust of air from the exhaust port 113.

According to the above embodiment, since the carrier mechanism 13 is provided in the treatment container 10, it is possible to grasp the outside surface of the wafer W using the grasping arms 35 and carry the wafer W between the transfer unit 11 and the developing treatment unit 12. Therefore, diffusion of contamination by the treatment solution as in the prior art can be prevented to restrain generation of particles in the treatment container 10.

Further, since the cleaning solution supply nozzle 80 movable in the Y-direction is provided in the developing treatment unit 12 in the treatment container 10, it is possible to move the cleaning solution supply nozzle 80 discharging the cleaning solution from one end portion to the other end portion of the wafer W to replace the developing solution on the wafer W with the cleaning solution to thereby form a heap of the cleaning solution on the wafer W.

Since the cleaning solution supply nozzle 80 is formed in an almost U-shape to be able to supply the cleaning solution to the front surface and the rear surface of the wafer W, the rear surface side of the wafer W can be cleaned.

Since the air blow-out nozzle 51 is provided between the transfer unit 11 and the developing treatment unit 12, it is possible to remove the cleaning solution on the wafer W to dry it when the wafer W moves from the developing treatment unit 12 to the transfer unit 11. This prevents the liquid which has adhered to the wafer W on the developing treatment unit 12 side from entering the transfer unit 11 to keep the transfer unit 11 clean. As a result, for example, no particle adheres to the wafer W carried into the transfer unit 11, thus ensuring that the wafer W is appropriately developed.

The air blow-out nozzle 51 forms the air curtain between the transfer unit 11 and the developing treatment unit 12. This can prevent mist floating in the developing treatment unit 12 from entering the transfer unit 11.

Since the air blow-out nozzle 70 is provided also on the lower side of the treatment container 10, the liquid adhering to the rear surface of the wafer W can also be removed.

Since the air supply port 110 is formed on the transfer unit 11 side and the exhaust port 113 is formed on the developing treatment unit 12 side to form the airflow in the treatment container 10 flowing from the transfer unit 11 side to the developing treatment unit 12 side, it is possible to prevent contaminant such as mist on the developing treatment unit 12 side from entering the transfer unit 11 side. As a result, development is appropriately performed without contamination of the wafer W carried into the transfer unit 11.

The springs 36 are provided between the grasping arms 35 and the second sliders 34 of the carrier mechanism 13 and therefore can buffer the impact when the grasping arms 35 come into contact with the outside surface of the wafer W. Further, it is also possible to flexibly cope with a slight misalignment of the wafer W on the support pins 22.

Since the fixed members 37 are provided on the rear side of the grasping arms 35, and the fixed members 37 and the grasping arms 35 are connected by the springs 38, the contact pressure when the grasping arms 35 grasp the wafer W can be kept constant.

The tip surface 35a of the grasping arm 35 is curved concavely inward from a lateral view. Accordingly, even if the height of the grasping arm 35 is slightly different from that of the wafer W, the concave of the tip surface 35a can guide the wafer W such that the grasping arm 35 aligns with the center of the wafer W in the thickness direction. As a result, it is possible to prevent the wafer W from falling off from the grasping arms 35 during carriage.

Further, since a heap of the cleaning solution is formed on the front surface of the wafer W and removed by the air knife from the one end portion toward the other end portion of the wafer W, the residual generated by development is removed with the residual being trapped in the cleaning solution. As a result, any residual never adheres to the wafer W, whereby development defects caused by the adhesion can be prevented.

Figure 8:
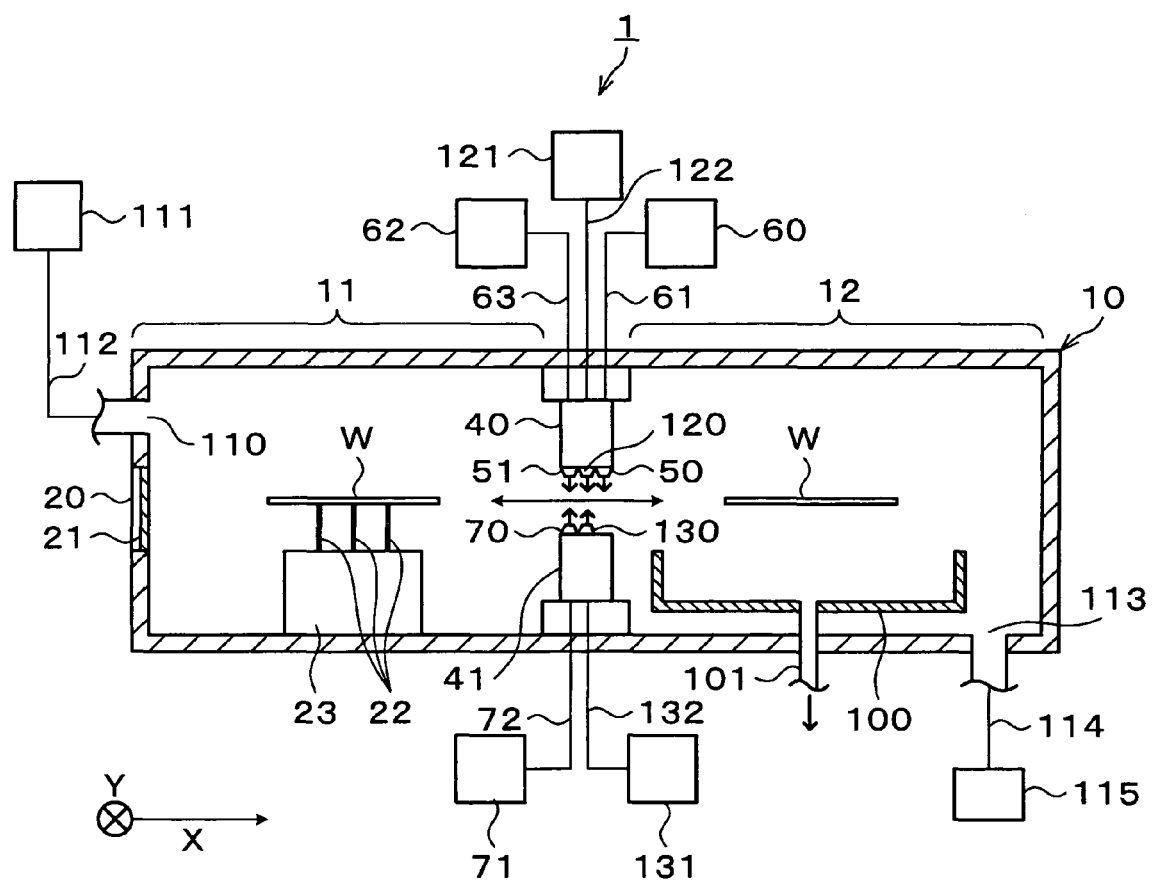
FIG. 8 is an explanatory view of a longitudinal section showing the outline of a configuration of the developing treatment apparatus where a cleaning solution supply nozzle is provided on the nozzle holding unit.
Figure 9:
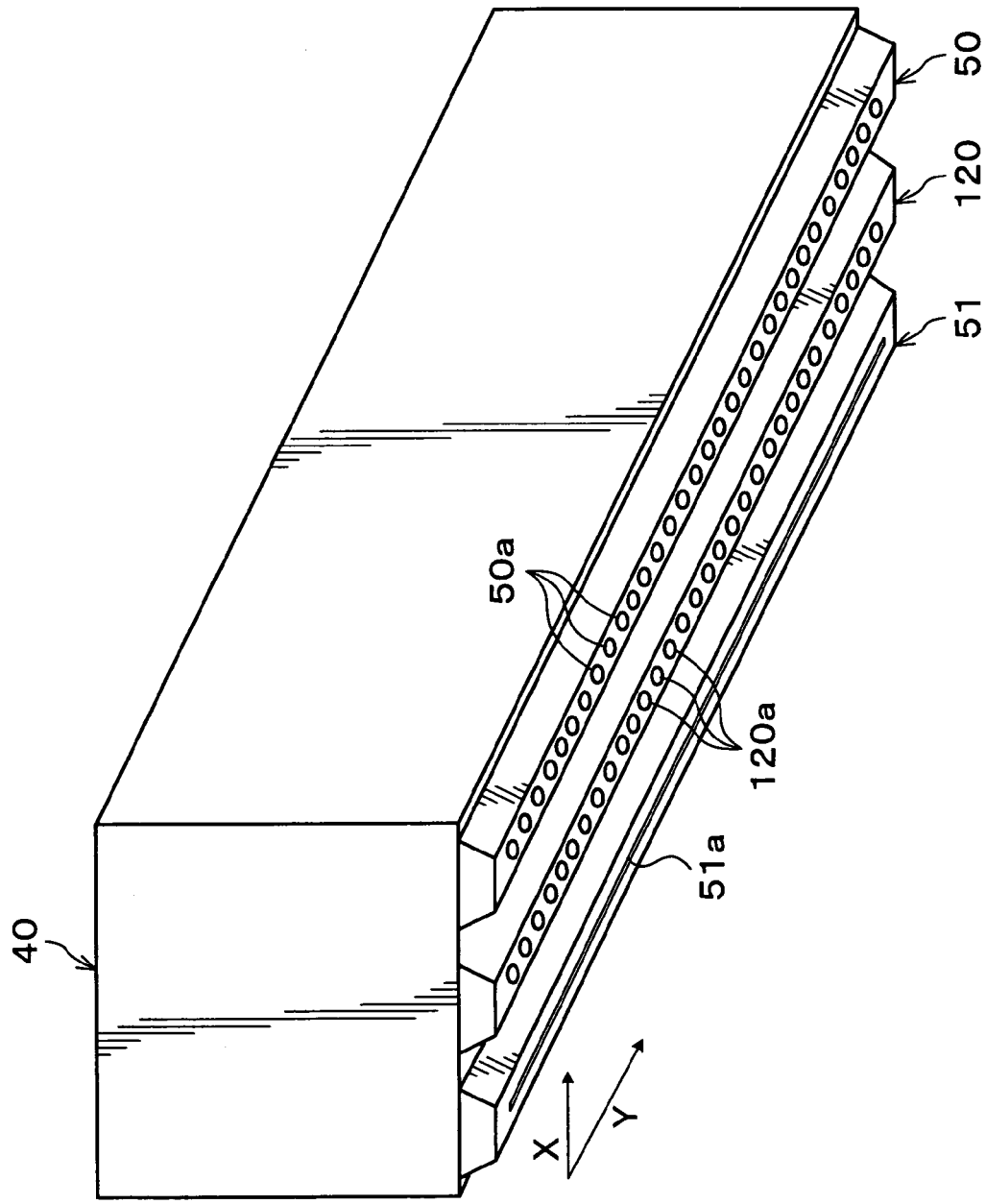
FIG. 9 is a perspective view showing the outline of a configuration of a nozzle holding unit provided with the cleaning solution supply nozzle.

While the cleaning solution supply nozzle 80 is disposed in the developing treatment unit 12 in the above embodiment, the cleaning solution supply nozzle 80 may be provided between the transfer unit 11 and the developing treatment unit 12. In this case, a cleaning solution supply nozzle 120 is provided between the developing solution supply nozzle 50 and the air blow-out nozzle 51 of the nozzle holding unit 40 as shown in FIG. 8. The cleaning solution supply 120 is formed across the nozzle holding unit 40 in its longitudinal direction (the Y-direction), for example, similarly to the developing solution supply nozzle 50, as shown in FIG. 9. The cleaning solution supply 120 is formed with a plurality of discharge ports 120a in the shape of circular holes arranged side by side in a line along the longitudinal direction. To the nozzle holding unit 40, for example, a cleaning solution supply pipe 122 is connected which communicates with a cleaning solution supply source 121 as shown in FIG. 8. The cleaning solution supply nozzle 120 can discharge the cleaning solution, which is supplied from the cleaning solution supply source 121 through the cleaning solution supply pipe 122, downward from the discharge ports 120a.

Further, the nozzle holding unit 41 on the lower side is also similarly provided with a cleaning solution supply nozzle 130. The cleaning solution supply nozzle 130 is disposed to face the cleaning solution supply nozzle 120. The cleaning solution supply nozzle 130 has the same configuration as that of the cleaning solution supply nozzle 120 and can discharge the cleaning solution, which is supplied from a cleaning solution supply source 131 through a cleaning solution supply pipe 132, upward from discharge ports.

Then, at the time when the wafer W for which the static development for the predetermined period has been finished moves in the negative direction in the X-direction on the transfer unit 11 side to pass between the nozzle holding units 40 and 41, the cleaning solution is discharged from the cleaning solution supply nozzle 120 and the cleaning solution supply nozzle 130. At this time, the jet of the air from the air blow-out nozzles 51 and 70 is stopped. For example, after the wafer W passes between the nozzle holding units 40 and 41 in the negative direction side in the X-direction, the wafer W next moves in the positive direction in the X-direction on the developing treatment unit 12 side to pass again between the cleaning solution supply nozzle 120 and the cleaning solution supply nozzle 130 both discharging the cleaning solution. This reciprocation may be performed a plurality of times. Thus, a heap of the cleaning solution is formed on the front surface side of the wafer W. In addition, the contamination on the rear surface side of the wafer W is removed. Then, the wafer W finally reached the developing treatment unit 12 side moves in the negative direction in the X-direction on the transfer unit 11 side. In this event, the discharge of the cleaning solution from the cleaning solution supply nozzles 120 and 130 is stopped, and instead air is blown out from the air blow-out nozzles 51 and 70 to form the air knife. Thus, as in the above embodiment, the cleaning solution on the front surface and the rear surface of the wafer W is removed so that the wafer W is dried.

Also in the above-described example, since the developing treatment of the wafer W can be performed with the grasping arms 35 grasping the outside surface of the wafer W, generation of particles in the treatment container 10 can be restrained as compared to the conventional roller-type carriage. Further, since the supply systems of the developing solution, the cleaning solution and the air are connected to the nozzle holding units 40 and 41 without movement, piping configuration of the supply systems can be simplified.

While the cleaning solution supply nozzles 120 and 130 are arranged above and below the carriage path of the wafer W in the above example, only the upper cleaning solution supply nozzle 120 may be provided. Further, as for the air blow-out nozzles 51 and 70, only the upper air blow-out nozzle 51 may be provided.

While the air blow-out nozzle 51 is used to form the air curtain between the transfer unit 11 and the developing treatment unit 12 in the above embodiment, an air supply unit for forming the air curtain may be separately provided.

Figure 10:
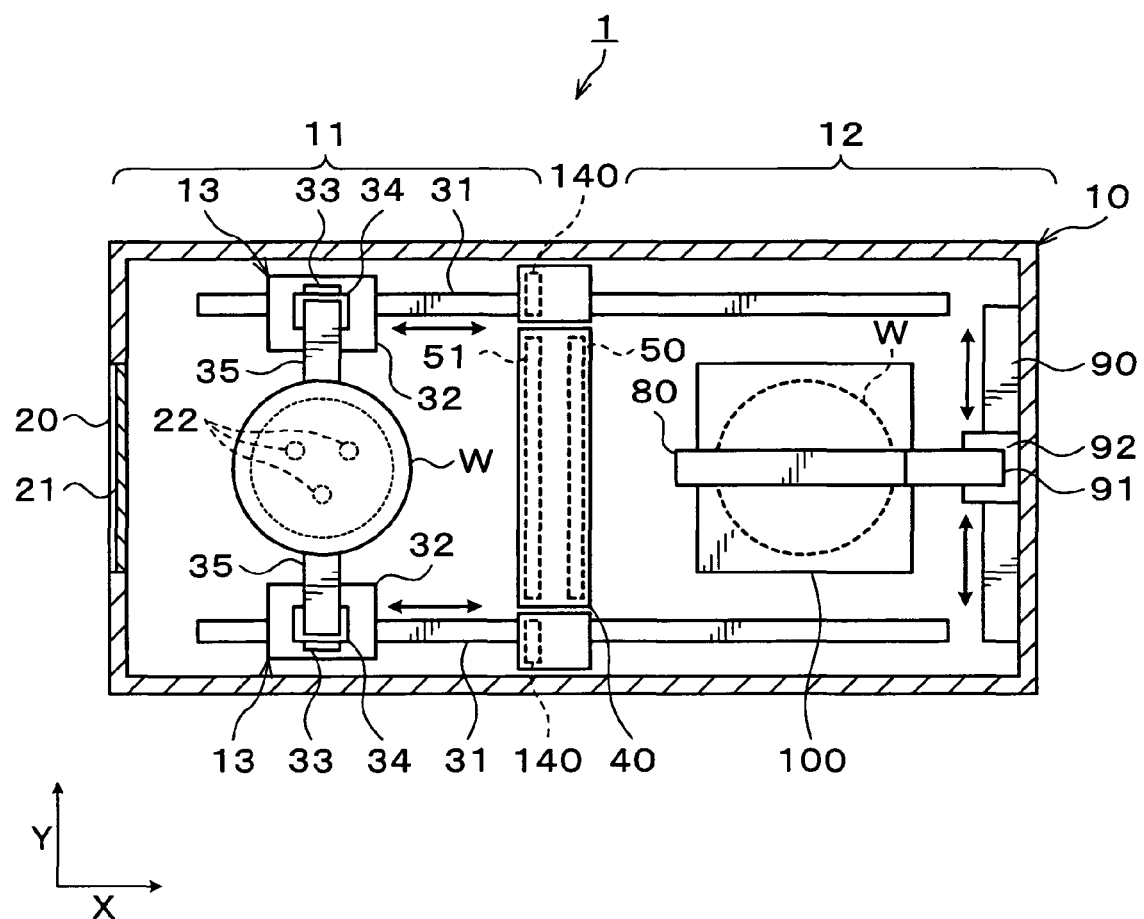
FIG. 10 is an explanatory view of a transverse section showing the outline of a configuration of a developing treatment apparatus where air blow-out nozzles are provided on both sides of the nozzle holding unit.

Furthermore, air blow-out nozzles 140 may be arranged above the first guide rails 31 on both sides in the longitudinal direction of the nozzle holding unit 40 in plan view as shown in FIG. 10. This arrangement allows the air curtain to be formed between the walls on both sides in the Y-direction of the treatment container 10, so as to surely prevent the atmosphere contaminated with the mist in the developing treatment unit 12 from flowing into the transfer unit 11. Note that in this event, the nozzle holding unit 40 may be extended to positions above the rails 31 so that the air blow-out nozzle 51 provided in the nozzle holding unit 40 may be formed between the walls on both sides in the Y-direction of the treatment container 10.

A preferred embodiment of the present invention has been described above with reference to the accompanying drawings, but the present invention is not limited to the embodiment. It should be understood that various changes and modifications are readily apparent to those skilled in the art within the spirit as set forth in claims, and those should also be covered by the technical scope of the present invention.

While the developing solution nozzle 50, the air bow-out nozzle 51, the cleaning solution supply nozzles 80, 120 and 130, and the air blow-out nozzle 70 comprise discharge ports or a blow-out port in the shape of circular holes or a slit in the above embodiment, each of the nozzles may comprise a discharge port or blow-out port in any shape.

Figure 11:
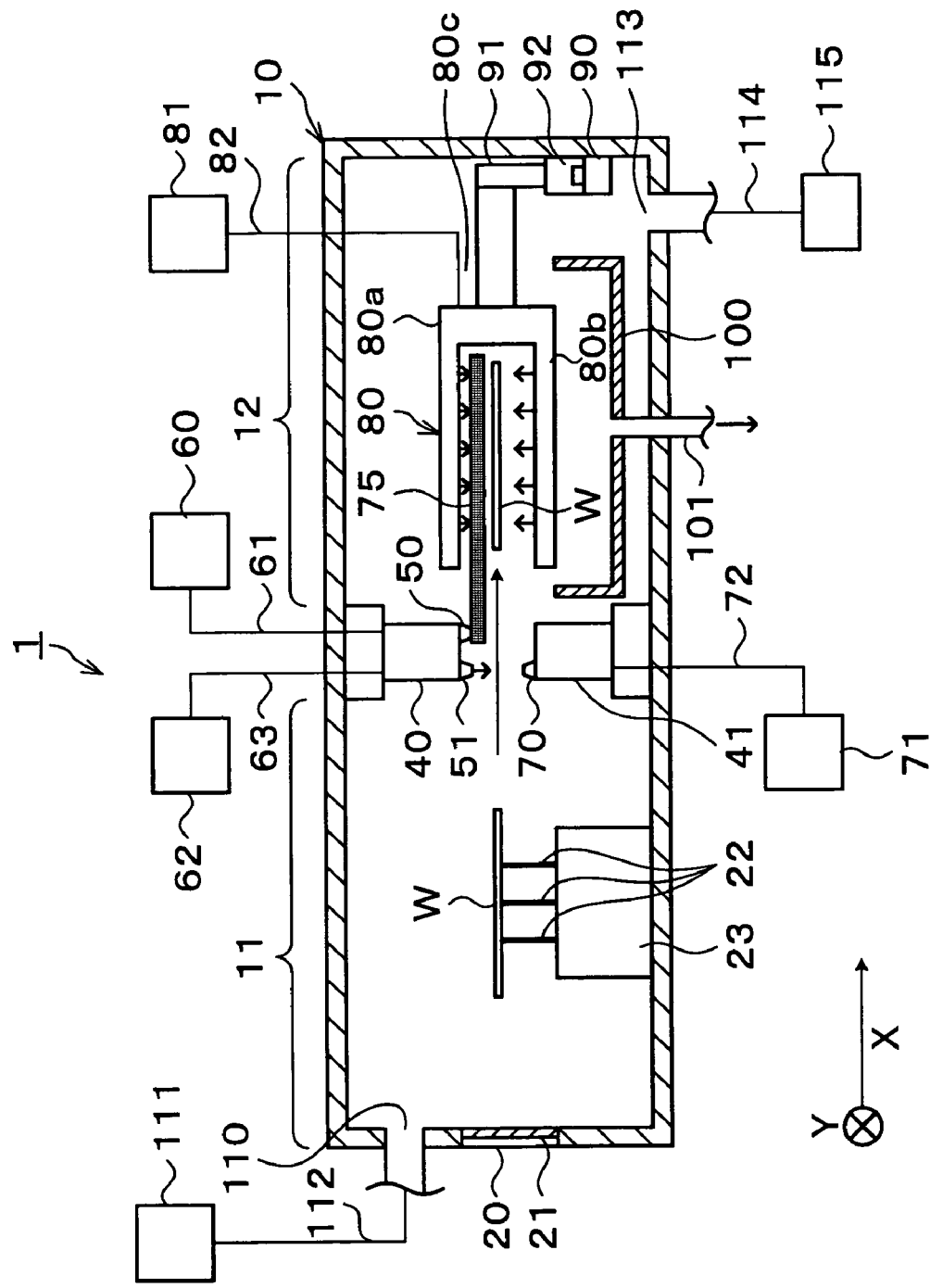
FIG. 11 is an explanatory view of a longitudinal section showing the outline of a configuration of a developing treatment apparatus according to another embodiment.
Figure 12:
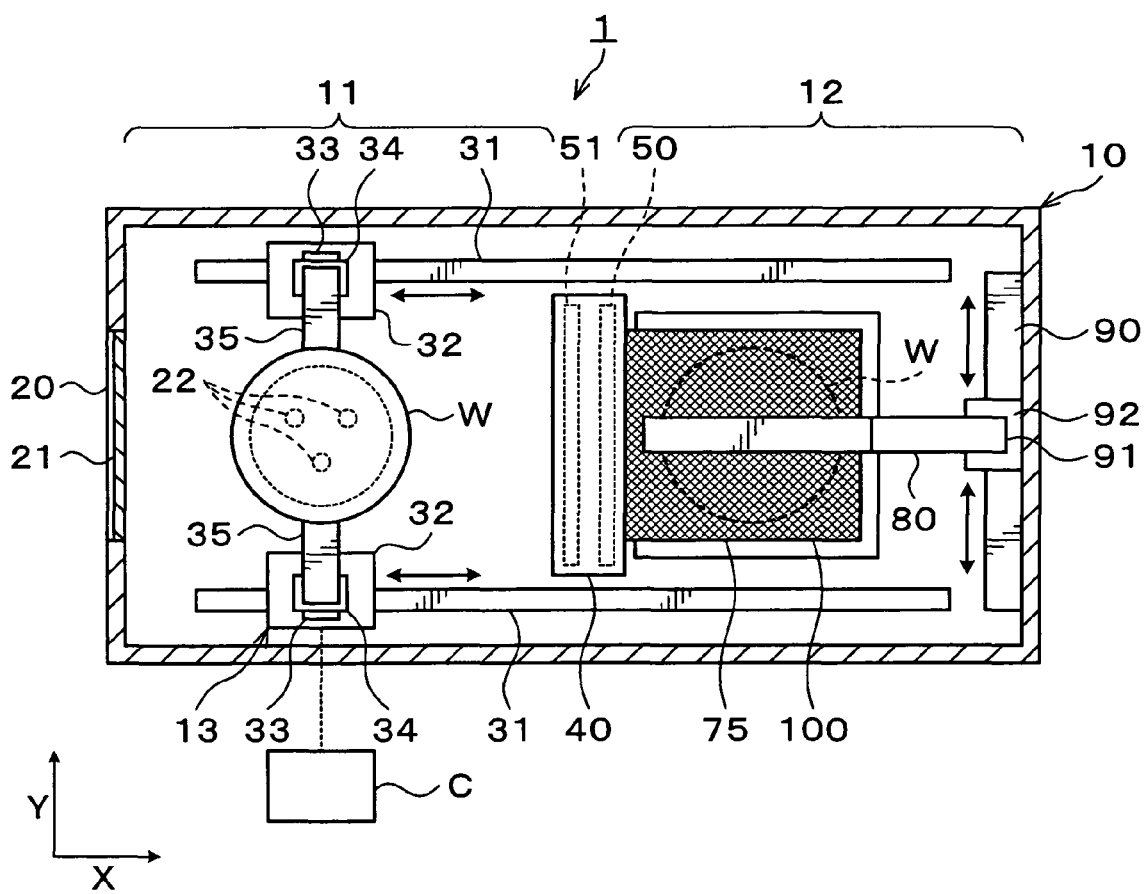
FIG. 12 is an explanatory view of a transverse section showing the outline of the configuration of the developing treatment apparatus.

Next, another embodiment will be described. FIG. 11 is an explanatory view of a longitudinal section showing the outline of a configuration of a developing treatment apparatus according to another embodiment, and FIG. 12 is an explanatory view of a transverse section showing the outline of the configuration of the developing treatment apparatus. The configuration of a developing treatment apparatus 1 according to the other embodiment is essentially the same as that shown in FIG. 1, in which members and so on shown by the same symbols and numbers in FIG. 12 have the same configurations as those of the developing treatment apparatus 1 shown in FIG. 1.

Further, in this embodiment, a mesh plate 75 through which liquid can pass is provided, for example, on a developing treatment unit 12 side. The mesh plate 75 is formed in a square having a side, for example, larger than the diameter of the wafer W as shown in FIG. 12 and can thus cover the entire upper surface of the wafer W. The mesh plate 75 has a thickness of, for example, about 0.1 mm to about 3.0 mm and has a mesh of, for example, about 100 meshes to about 300 meshes (the number of meshes in one inch). As the material of the mesh plate 75, for example, polyarylate or polyamide resin is used. The mesh plate 75 has been subjected to hydrophilic treatment to have a contact angle with the developing solution set to 10° or less. Note that the hydrophilic treatment may be performed by infiltrating a hydrophilizing agent into the material of the mesh plate 75, or by performing plasma processing and then oxidation treatment on the mesh plate 75. Further, the contact angle of the mesh plate 75 is more preferably between a measuring limit close to 0° and 5°.

The mesh plate 75 has one end portion on a transfer unit 11 side located below discharge ports 50a of a developing solution supply nozzle 50 as shown in FIG. 11 and is formed horizontally starting from the position below the discharge ports 50a toward the developing treatment unit 12 side. Further, the mesh plate 75 is set at a position slightly higher, for example, by about 0.5 mm to about 3.0 mm than the carriage path of the wafer W by a carrier mechanism 13. With this arrangement, when the wafer W moves from the transfer unit 11 side toward the developing treatment unit 12 side to pass under the developing solution supply nozzle 50, the mesh plate 75 lies between the developing solution supply nozzle 50 and the wafer W, and the wafer W moves, closely to the mesh plate 75, on the lower surface side of the mesh plate 75. The developing solution discharged from the developing solution supply nozzle 50 is supplied onto the upper surface of the wafer W through the mesh plate 75 and thus sandwiched between the wafer W and the mesh plate 75.

In the developing treatment unit 12, a cleaning solution supply nozzle 80 is disposed. The cleaning solution supply nozzle 80 is formed in an almost U-shape with an opening on the negative direction side in the X-direction. More specifically, the cleaning solution supply nozzle 80 is composed, as shown in FIG. 11, of an elongated upper nozzle 80a along the X-direction located above the wafer W and the mesh plate 75, an elongated lower nozzle 80b along the X-direction located below the wafer W and the mesh plate 75, and a vertical connecting portion 80c located beside the wafer W on the positive direction side in the X-direction for connecting an end portion of the upper nozzle 80a and an end portion of the lower nozzle 80b. Then, the cleaning solution is supplied onto the upper surface of the wafer W through the mesh plate 75.

Next, a developing process performed in the developing treatment apparatus 1 configured as described above will be described.

For example, during the developing treatment, the air supply from an air supply port 110 and the exhaust of air from an exhaust port 113 are performed at all times, so that airflow of clean air is formed in a treatment container 10 which flows from the transfer unit 11 to the developing treatment unit 12. Further, air is blown out, for example, from an air blow-out nozzle 51 to form an air curtain between nozzle holding units 40 and 41.

Then, the wafer W is first carried by an external carrier arm into the transfer unit 11 through a carrier port 20 and supported on support pins 22 as shown in FIG. 11. After the wafer W is supported on the support pins 22, grasping arms 35 waiting on both sides in the Y-direction move toward the wafer W so that the grasping arms 35 grasp the outside surface of the wafer W on both sides in the Y-direction as shown in FIG. 12. The wafer W is then horizontally moved by the grasping arms 35 in the positive direction in the X-direction on the developing treatment unit 12 side. Immediately before the wafer W passes between the nozzle holding units 40 and 41, the developing solution starts to be discharged from the developing solution supply nozzle 50, and the wafer W passes under the developing solution supply nozzle 50 discharging the developing solution.

Figure 13A:
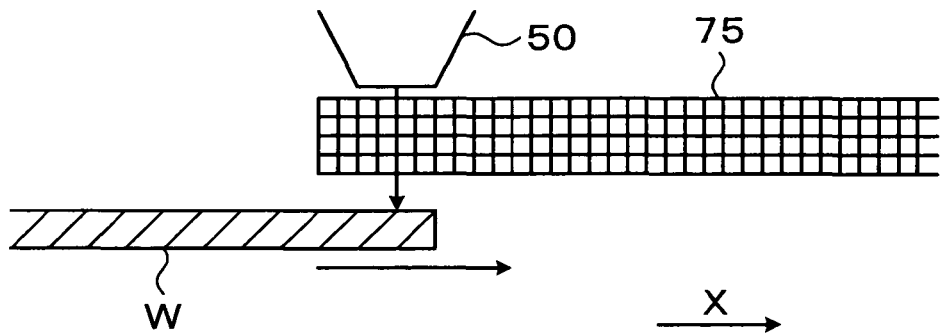
FIG. 13A is an explanatory view showing an appearance when a developing solution starts to be supplied to a wafer.
Figure 13B:
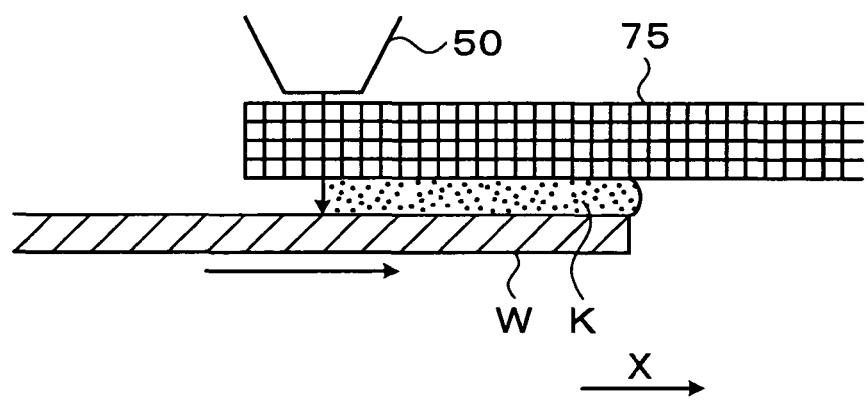
FIG. 13B is an explanatory view showing an appearance when the developing solution is being supplied to the wafer.
Figure 13C:
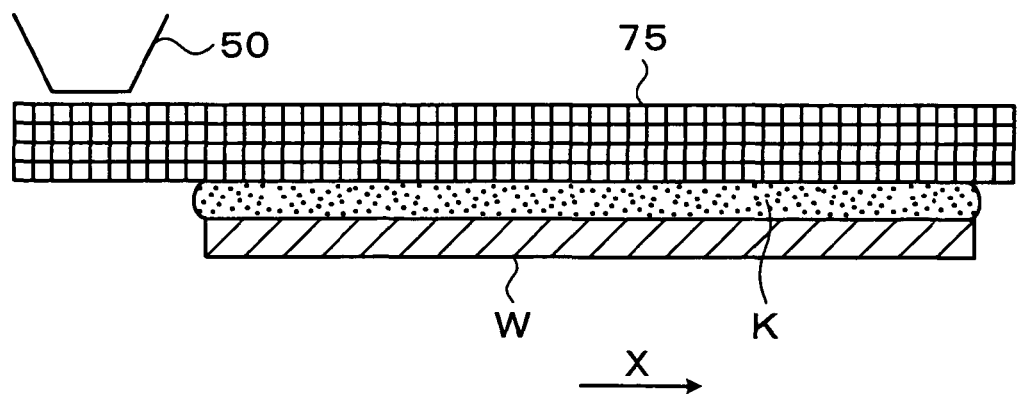
FIG. 13C is an explanatory view showing an appearance after the developing solution has been supplied to the wafer.

In this event, the developing solution discharged from the developing solution supply nozzle 50 is supplied onto the front surface of the wafer W through the mesh plate 75 as shown in FIG. 13A. The developing solution K supplied on the wafer W moves in the positive direction side in the X-direction along the lower surface of the mesh plate 75 while being sandwiched between the wafer W and the mesh plate 75 and mounted on the wafer W as shown in FIG. 13B. Since the mesh plate 75 is hydrophilic, the shear resistance between the developing solution K and the mesh plate 75 is small to restrain the developing solution K from flowing on the wafer W. Then, when the wafer W has passed under the developing solution supply nozzle 50 as shown in FIG. 13C, the wafer W is stopped. At this time, the developing solution K is applied on the entire front surface of the wafer W with the developing solution K filled between the wafer W and the mesh plate 75. The developing solution K is retained between the mesh plate 75 and the wafer W, whereby a thick liquid film of the developing solution K is formed on the front surface of the wafer W so that the wafer W is developed.

The wafer W, held by the grasping arms 35, is subjected to static development for a predetermined period. After a lapse of the predetermined period, the cleaning solution supply nozzle 80 moves in the Y-direction from one end portion side to the other end portion side of the wafer W while discharging the cleaning solution. For example, the cleaning solution supply nozzle 80 reciprocates a plurality of times between both the end portions of the wafer W. Onto the front surface side of the wafer W, the cleaning solution is supplied from the upper nozzle 80a of the cleaning solution supply nozzle 80 through the mesh plate 75. This replaces the developing solution on the front surface of the wafer W with the cleaning solution so that a liquid film (a heap) of the cleaning solution is formed on the wafer W. The supply of the cleaning solution stops the development of the wafer W.

After formation of the heap of the cleaning solution on the front surface of the wafer W, the wafer W is then moved by the grasping arms 35 in the negative direction in the X-direction on the transfer unit 11 side. Immediately before the wafer W passes between the nozzle holding units 40 and 41, air is jetted from the air blow-out nozzle 70 on the lower side. Further, the flow rate of air jetted from the air blow-out nozzle 51 on the upper side is increased. The wafer W passes through the position where the air is blown out from above and below, whereby the heap of the cleaning solution on the front surface of the wafer W and the liquid adhering to the rear surface of the wafer W are removed. In this event, the air from the air blow-out nozzle 51 serves as the air knife as shown in the previously explained FIG. 7 such that the pressure of the air removes a cleaning solution R on the front surface of the wafer W at once from one end portion toward the other end portion of the wafer W to dry the wafer W.

When moved to a position above the support pins 22 in the transfer unit 11, the wafer W is stopped and transferred from the grasping arms 35 onto the support pins 22. Thereafter, the wafer W is carried out by the external carrier arm via the carrier port 20, whereby a series of processes of the developing treatment is finished. Note that the series of processes of the developing treatment is realized by the control unit C, for example, controlling the driving of the carrier mechanism 13 and the cleaning solution supply nozzle 80, the start/stop of discharge or jet from the nozzles, and start/stop of the air supply from the air supply port 110 and the exhaust of air from the exhaust port 113.

According to the above embodiment, since the mesh plate 75 which has been subjected to hydrophilic treatment lies below the developing solution supply nozzle 50, the mesh plate 75 has an excellent wettability with respect to the developing solution. Therefore, even when the developing solution is supplied between the mesh plate 75 and the wafer W while the wafer W is moving under the mesh plate 75, flow of the developing solution on the wafer W is restrained because of a small shear resistance between the developing solution on the wafer W and the mesh plate 75. As a result, the developing solution on the wafer W becomes stable, so that the development within the wafer is performed stably and evenly.

Since the mesh plate 75 is formed starting from a position below the developing solution supply nozzle 50 toward the direction of movement of the wafer W, the developing solution supplied on the wafer W is held between the wafer W and the mesh plate 75. This also restrains flow of the developing solution so that the development of the wafer W is performed stably.

Since the cleaning solution can be supplied onto the wafer W through the mesh plate 75 by the cleaning solution supply nozzle 80, a heap of the cleaning solution having a thickness corresponding to the gap between the mesh plate 75 and the wafer W can be formed on the wafer W. This can supply a sufficient amount of cleaning solution onto the wafer W to prevent the residual of development remaining on the wafer W from adhering to a pattern. Then, the air knife from the air blow-out nozzle 51 can remove the cleaning solution on the wafer W with the residual being trapped in the cleaning solution.

Further, since the carrier mechanism 13 can carry the wafer W with the grasping arms 35 grasping the outside surface of the wafer W, members for carriage never come into contact with the rear surface of the wafer W so that the rear surface of the wafer W is never contaminated.

Since the air blow-out nozzle 51 is provided between the transfer unit 11 and the developing treatment unit 12, it is possible to remove the cleaning solution on the wafer W to dry it when the wafer W moves from the developing treatment unit 12 to the transfer unit 11. This prevents the liquid which has adhered to the wafer W on the developing treatment unit 12 side from entering the transfer unit 11 to keep the transfer unit 11 clean. As a result, for example, no particle adheres to the wafer W carried into the transfer unit 11, thus ensuring that the wafer W is appropriately developed.

Figure 14:
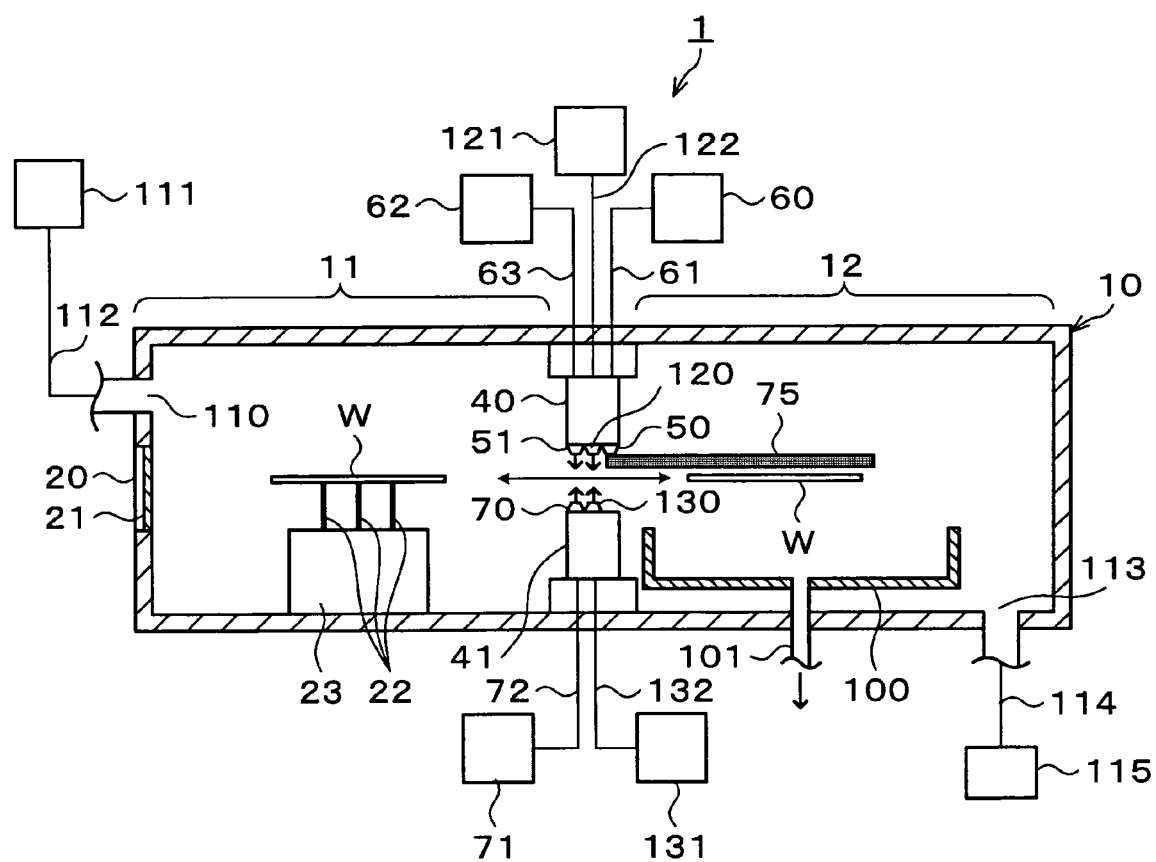
FIG. 14 is an explanatory view of a longitudinal section showing the outline of a configuration of a developing treatment apparatus where a cleaning solution supply nozzle is provided on the nozzle holding unit.

While the cleaning solution supply nozzle 80 is disposed in the developing treatment unit 12 in the above embodiment, the cleaning solution supply nozzle 80 may be provided between the transfer unit 11 and the developing treatment unit 12. In this case, a cleaning solution supply nozzle 120 is provided between the developing solution supply nozzle 50 and the air blow-out nozzle 51 of the nozzle holding unit 40 as shown in FIG. 14. To the nozzle holding unit 40, for example, a cleaning solution supply pipe 122 is connected which communicates with a cleaning solution supply source 121 as shown in FIG. 14. The cleaning solution supply nozzle 120 can discharge the cleaning solution, which is supplied from the cleaning solution supply source 121 through the cleaning solution supply pipe 122, downward from the discharge ports 120a. Note that the mesh plate 75 may or may not cover the discharge ports 120a of the cleaning solution supply nozzle 120.

The process for the wafer W for which the static development for the predetermined period has been finished is similar to that in the above-described embodiment in FIG. 8.

Since the supply systems of the developing solution, cleaning solution, and the air are connected to the nozzle holding units 40 and 41 without movement, piping configuration of the supply systems can be simplified.

Figure 15:
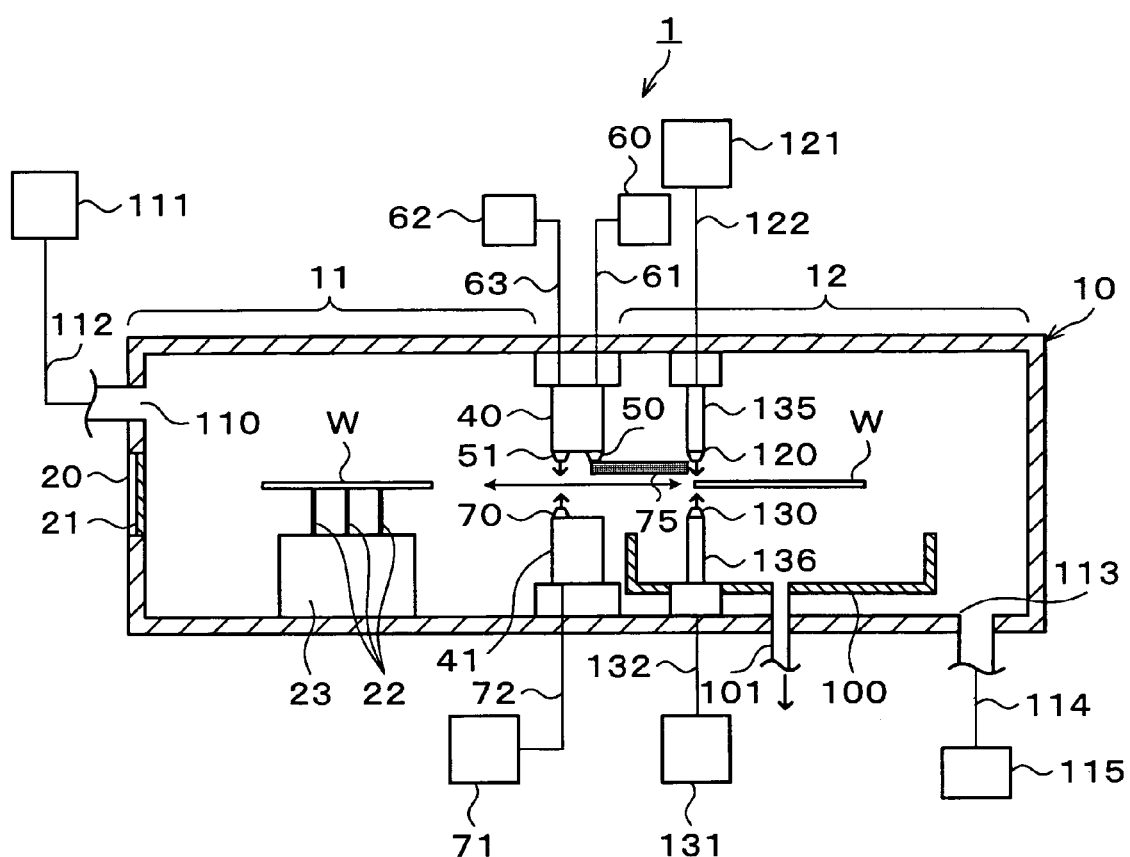
FIG. 15 is an explanatory view of a longitudinal section showing the outline of a configuration of a developing treatment apparatus where the cleaning solution supply nozzle is provided at a position adjacent to a mesh plate.

While the cleaning solution supply nozzle 120 is provided between the transfer unit 11 and the developing treatment unit 12 in the above-described embodiment, the cleaning solution supply nozzle 120 may be provided adjacent to the mesh plate 75 on the positive direction side in the X-direction of the mesh plate 75. FIG. 15 shows such an example. For example, the mesh plate 75 is formed such that the length in the X-direction is smaller, for example, shorter than the diameter of the wafer W. For example, the mesh plate 75 is formed to have a length, for example, about half the diameter of the wafer W.

On the positive direction side in the X-direction of the mesh plate 75, the above-described cleaning solution supply nozzle 120 is provided closely to the mesh plate 75. The distance in the X-direction from the discharge position of the developing solution supply nozzle 50 to the discharge position of the cleaning solution supply nozzle 120 is set to be smaller than the diameter of the wafer W, for example, about half the diameter of the wafer W. The cleaning solution supply nozzle 120 is held by a nozzle holding unit 135 fixed, for example, to the ceiling surface of the treatment container 10. Further, under the cleaning solution supply nozzle 120, a cleaning solution supply nozzle 130 is provided as in the above-described embodiment. The cleaning solution supply nozzle 130 is held by the nozzle holding unit 136. The carrier mechanism 13 allows the wafer W to pass under the mesh plate 75 along the mesh plate 75 and further pass under the discharge ports 120a of the cleaning solution supply nozzle 120.

Figure 16A:
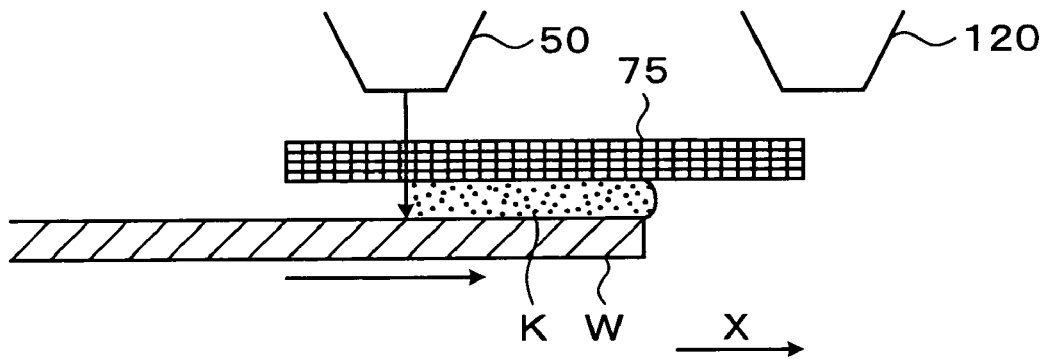
FIG. 16A is an explanatory view showing an appearance when a developing solution starts to be supplied to a wafer.
Figure 16B:
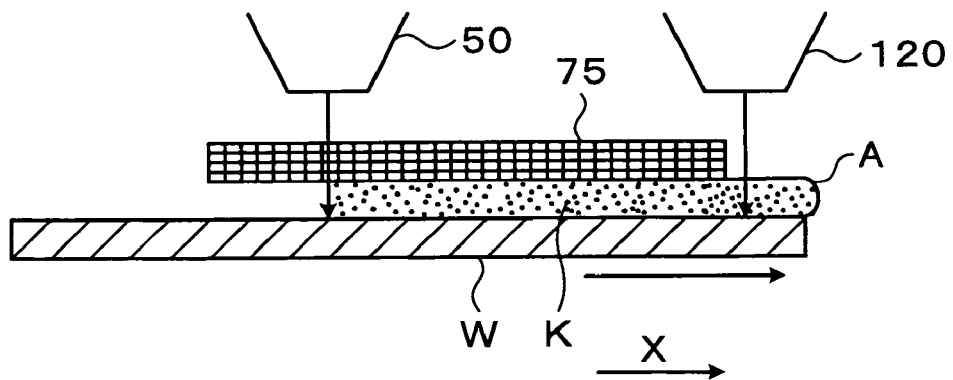
FIG. 16B is an explanatory view showing an appearance when a cleaning solution is being supplied to the wafer.

Then, at the time of developing treatment, the wafer W in the transfer unit 11 is carried by the carrier mechanism 13 in the positive direction in the X-direction on the developing treatment unit 12 side as in the above-described embodiment. In this event, as shown in FIG. 16A, the developing solution K is supplied from the developing solution supply nozzle 50 onto the front surface of the wafer W through the mesh plate 75. The wafer W passes under the mesh plate 75 while being supplied with a heap of the developing solution K, during which development of the wafer W is performed. As shown in FIG. 16B, a cleaning solution A is discharged from the cleaning solution supply nozzle 120, such that the wafer W is supplied with the cleaning solution A immediately after the wafer W has passed under the mesh plate 75. With the supply of the cleaning solution A, the development is stopped. Thus, the period from the supply of the developing solution K from the developing solution supply nozzle 50 to the supply of the cleaning solution A from the cleaning solution supply nozzle 120 on the positive direction side in the X-direction of the mesh plate 75 is the development period of the wafer W. The development period is controlled by adjusting the carriage speed of the wafer W by the carrier mechanism 13.

Figure 16C:
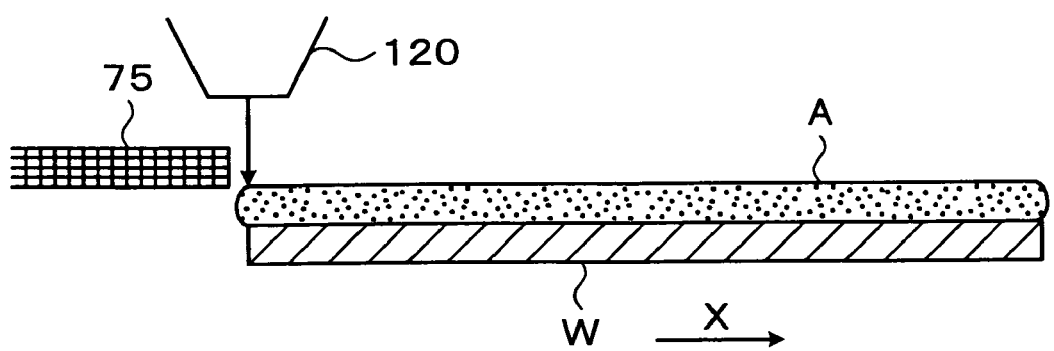
FIG. 16C is an explanatory view showing an appearance when the wafer has passed under the cleaning solution supply nozzle.

When the wafer W passes under the cleaning solution supply nozzle 120 as shown in FIG. 16C, the cleaning solution A is supplied onto the entire front surface of the wafer W, whereby the development of the entire surface of the wafer W is stopped. In this event, a heap of the cleaning solution A is formed on the front surface of the wafer W. Further, the cleaning solution is discharged also from the cleaning solution supply nozzle 130 during the passage of the wafer W so that the rear surface side of the wafer W is also cleaned.

After the formation of the heap of the cleaning solution on the wafer W, the wafer W is moved in the negative direction in the X-direction on the transfer unit 11 side and dried by the air from the air blow-out nozzles 51 and 70.

According to this embodiment, the period from the supply of the developing solution to the supply of the cleaning solution is uniform at any points on the wafer front surface, so that the development can be uniformly performed within the wafer. Further, the developing period of the wafer W can be easily controlled by adjusting the carriage speed of the wafer W by the carrier mechanism 13.

Figure 17:
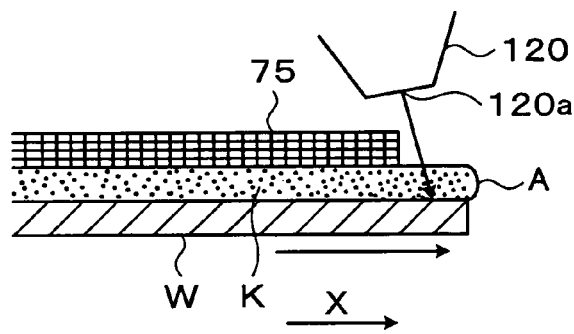
FIG. 17 is an explanatory view showing a cleaning solution supply nozzle where a discharge direction is obliquely downward.

The cleaning solution supply nozzle 120 described in the above embodiment may have discharge ports 120*a* directed obliquely downward on the opposite side to the mesh plate 75 as shown in FIG. 17. This arrangement can prevent the cleaning solution from and entering and contaminating the mesh plate 75.

While the mesh plate 75 is fixedly arranged in the above embodiment, it may be moved with the movement of the wafer W.

Figure 18:
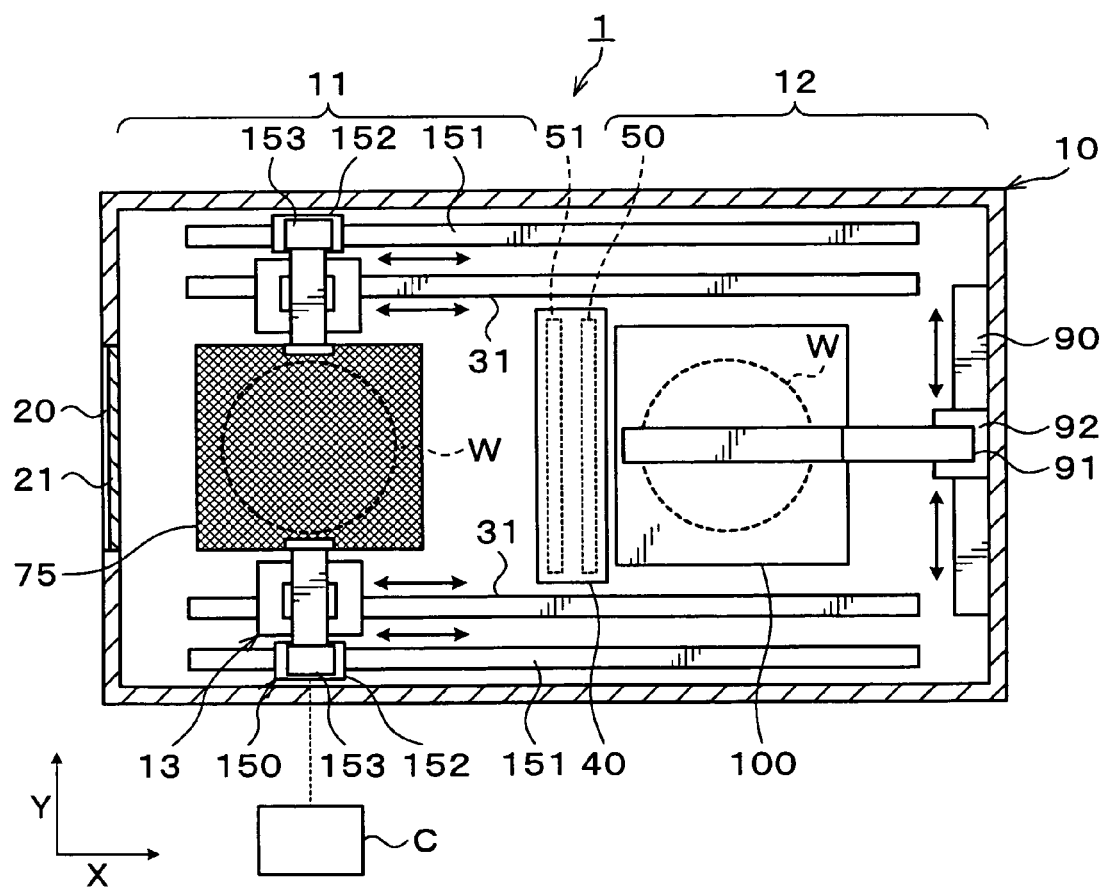
FIG. 18 is an explanatory view of a transverse section showing the outline of a configuration of a developing treatment apparatus where a mesh plate carrier mechanism is provided.
Figure 19:
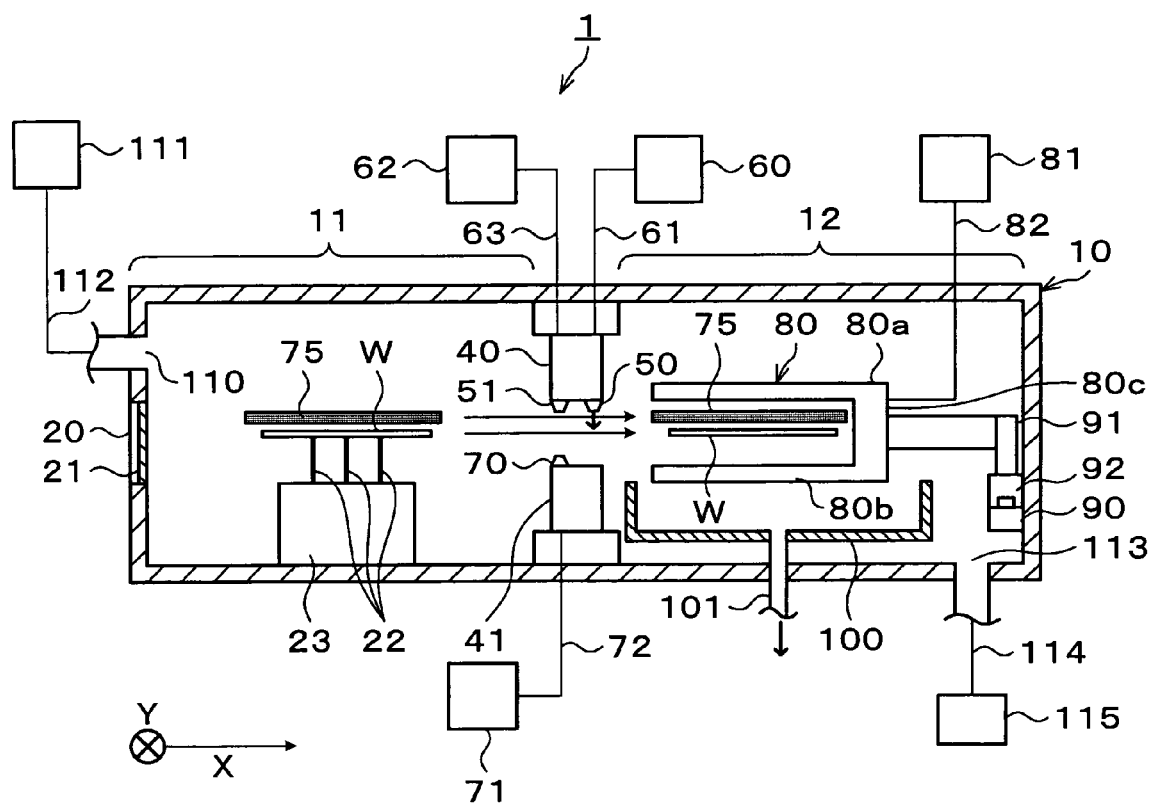
FIG. 19 is an explanatory view of a longitudinal section showing the outline of the configuration of the developing treatment apparatus where the mesh plate carrier mechanism is provided.

FIG. 18 shows such an example. As shown in FIG. 18, a mesh plate carrier mechanism 150 for holding and carrying the mesh plate 75 is provided in the treatment container 10. The mesh plate carrier mechanism 150 can carry the mesh plate 75 in the X-direction at a level higher than the carriage path of the wafer by the carrier mechanism 13 and lower than the developing solution nozzle 50 as shown in FIG. 19.

The mesh plate carrier mechanism 150 includes rails 151 extending parallel to the rails 31 from the transfer unit 11 to the developing treatment unit 12, for example, outside the rails 31 in the treatment container 10 as shown in FIG. 18. On each of the rails 151, a slider 152 is provided. The slider 152 includes, for example, a drive source such as a motor and can thus move in the X-direction along the rail 151.

To the top of each of the sliders 152, a holding arm 153 is attached which holds an end portion in the Y-direction of the mesh plate 75.

In this embodiment, the mesh plate carrier mechanism 150 is composed of the rails 151, the sliders 152, and the holding arms 153. The mesh plate carrier mechanism 150 can be used to move the holding arms 153 holding the mesh plate 75 in the X-direction to carry the mesh plate 75 between the transfer unit 11 and the developing treatment unit 12. Note that the control of the operation of the mesh plate carrier mechanism 150 is performed by the control unit C.

Then, at the time of developing treatment, after the wafer W is carried from the outside into the treatment container 10 and supported on the support pins 22, the mesh plate 75 is first disposed above the wafer W. In this event, the mesh plate 75 is disposed to cover the entire upper surface of the wafer W in plan view. Then, when the wafer W is moved by the carrier mechanism 13 to the developing treatment unit 12 side, the mesh plate 75 is also moved by the mesh plate carrier mechanism 150 to the developing treatment unit 12 side as in the above-described embodiment. In this event, the mesh plate 75 is carried at the same speed as that of the wafer W to keep covering the upper surface of the wafer W.

Figure 20:
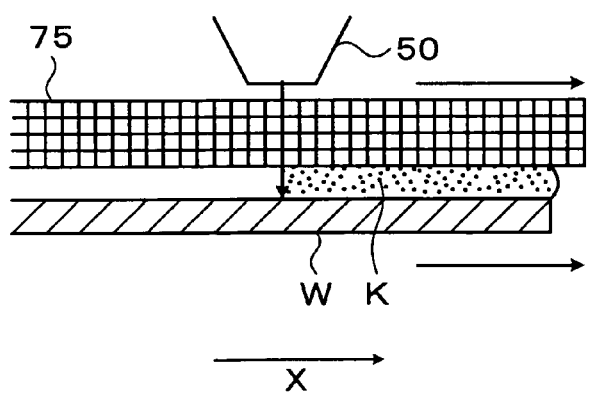
FIG. 20 is an explanatory view showing an appearance in which the developing solution is supplied to the wafer while the mesh plate and the wafer are being moved.

Before the wafer W passes under the developing solution supply nozzle 50, the discharge of the developing solution is started, so that the developing solution K is supplied onto the wafer W through the mesh plate 75 when the wafer W passes under the developing solution supply nozzle 50 as shown in FIG. 20. The developing solution K supplied on the wafer W is sandwiched and filled between the mesh plate 75 and the wafer W. In this event, since the mesh plate 75 is highly hydrophilic as in the above-described embodiment, the shear resistance between the mesh plate 75 and the developing solution K is small to restrain the developing solution K from flowing on the wafer W. When the wafer W and the mesh plate 75 have passed under the developing solution supply nozzle 50, the developing solution K is supplied onto the entire front surface of the wafer W.

The wafer W and the mesh plate 75 passed under the developing solution supply nozzle 50 are stopped at positions surrounded by the cleaning solution supply nozzle 80 on the developing treatment unit 12 side from a lateral view as shown in FIG. 19. The wafer W is subjected to static development for a predetermined period in this state. When the static development is finished, the cleaning solution supply nozzle 80 moves in the Y-direction from one end portion side to the other end portion side of the wafer W while discharging the cleaning solution as in the above-described embodiment, whereby a heap of the cleaning solution is formed on the front surface of the wafer W.

Figure 21:
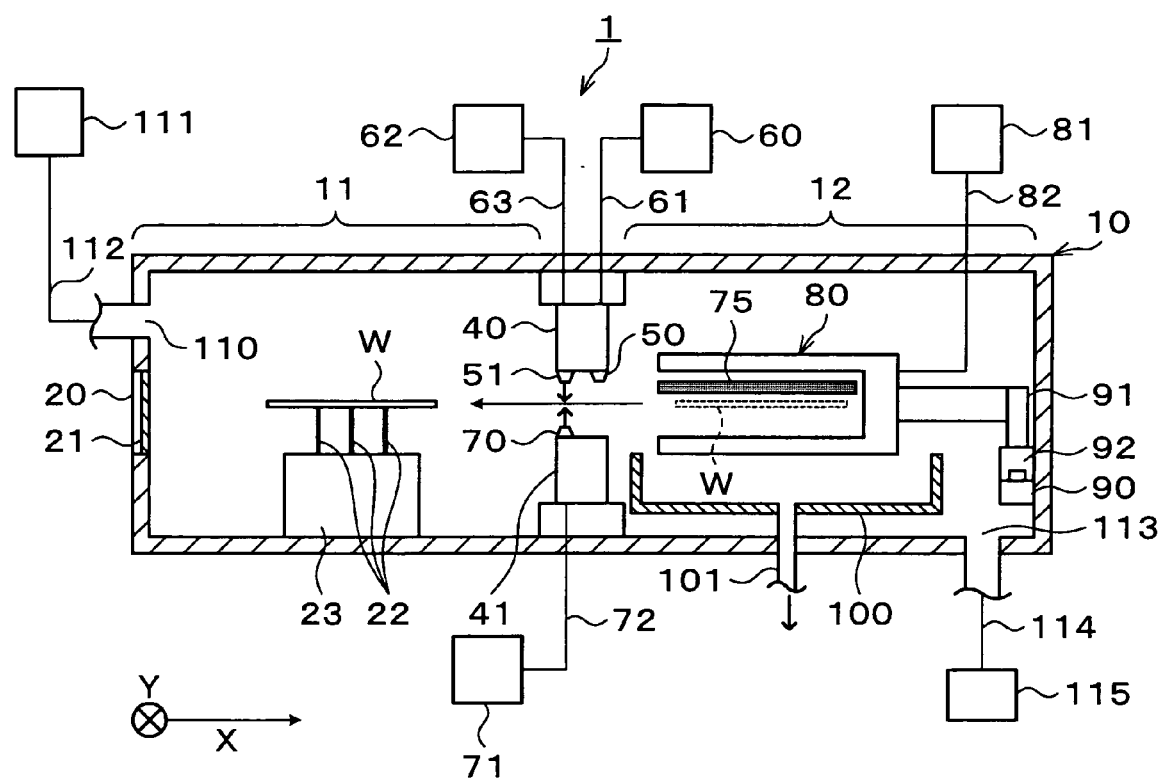
FIG. 21 is an explanatory view of a longitudinal section of a developing treatment apparatus showing an appearance in which only the wafer is returned to a transfer unit side.

Then, for example, only the wafer W is moved in the negative direction in the X-direction on the transfer unit 11 side as shown in FIG. 21, and the air knife from the air blow-out nozzle 51 removes the heap of the cleaning solution on the front surface of the wafer W as in the above-described embodiment. Further, the liquid on the rear surface of the wafer W is also removed by the air from the air blow-out nozzle 70.

When moved to a position above the support pins 22 in the transfer unit 11, the wafer W is stopped and transferred onto the support pins 22. The wafer W is then carried out by the external carrier arm via the carrier port 20.

On the other hand, the mesh plate 75 is moved, for example, after the wafer W is carried out, to the transfer unit 11 side and dried by the air blow-out nozzles 51 and 70 in a manner similar to that for the wafer W. The mesh plate 75 is then waiting, for example, at a position above the support pins 22 until a next wafer W is carried in.

According to this embodiment, since the mesh plate 75 which has been subjected to the hydrophilic treatment also lies between the moving wafer W and the developing solution supply nozzle 50, the wettability of the mesh plate 75 increases with respect to the developing solution. Therefore, even when the developing solution is supplied while the wafer W is moving, flow of the developing solution on the wafer W is restrained because of a small shear resistance between the developing solution on the wafer W and the mesh plate 75. As a result, the developing solution on the wafer W becomes stable, so that the development within the wafer is performed stably and evenly.

Note that in the above-described embodiment in which the mesh plate 75 and the wafer W are moved together, the cleaning solution supply nozzle 80 may be disposed between the transfer unit 11 and the developing treatment unit 12.

The preferred embodiments of the present invention have been described with reference to the accompanying drawings, but the present invention is not limited to those embodiments. For example, while the whole mesh plate 75 has been subjected to the hydrophilic treatment in the above-described embodiments, it is only required that at least the lower surface of the mesh plate 75 has been subjected to the hydrophilic treatment.

Besides, while the above-described embodiments are for performing developing treatment on the wafer W, the present invention is also applicable to the case of performing developing treatment on other substrates such as an FPD (Flat Panel Display), a mask reticle for a photomask, and the like other than the wafer.

The present invention is useful in restraining generation of particles in a developing treatment apparatus without rotation of a substrate. Further, the present invention is useful in restraining convection in a developing solution supplied on the substrate.

What is claimed is:

1. A substrate developing treatment apparatus, comprising:
a substrate transfer unit into/from which a substrate is transferred from/to the outside of a treatment container and a developing treatment unit in which development of the substrate is performed, said substrate transfer unit and said developing treatment unit being arranged side by side in said treatment container;
a carrier mechanism provided in said treatment container for carrying the substrate while grasping an outside surface of the substrate from both sides, between said substrate transfer unit and said developing treatment unit;
a developing solution supply nozzle for supplying a developing solution onto the substrate and a gas blow nozzle for blowing a gas to the substrate, said developing solution supply nozzle and said gas blow nozzle being provided between said substrate transfer unit and said developing treatment unit and above a carriage path along which the substrate is carried by said carrier mechanism; and
a cleaning solution supply nozzle provided in said developing treatment unit for supplying a cleaning solution onto the substrate.

2. The substrate developing treatment apparatus as set forth in claim 1,
wherein said cleaning solution supply nozzle supplies the cleaning solution onto the substrate while moving horizontally in a direction perpendicular to the carriage direction of the substrate by said carrier mechanism.

3. The substrate developing treatment apparatus as set forth in claim 2,
wherein said cleaning solution supply nozzle comprises an upper nozzle for supplying the cleaning solution onto an upper surface of the substrate and a lower nozzle for supplying the cleaning solution to a lower surface of the substrate in a manner to hold the substrate in said developing treatment unit therebetween, and
wherein said upper nozzle and said lower nozzle are configured to be able to discharge the cleaning solution from one end portion to another end portion of the substrate in the carriage direction of the substrate.

4. The substrate developing treatment apparatus as set forth in claim 3,
wherein said cleaning solution supply nozzle is formed in an almost U-shape surrounding the upper surface of the substrate in said developing treatment unit and a side surface of the substrate opposite to said substrate transfer unit, and the lower surface of the substrate.

5. The substrate developing treatment apparatus as set forth in claim 1, further comprising:
a nozzle holding unit provided between said substrate transfer unit and said developing treatment unit and above the carriage path of the substrate,
wherein, in said nozzle holding unit, said gas blow nozzle and said developing solution supply nozzle are arranged side by side in this order from said substrate transfer unit toward said developing treatment unit.

6. The substrate developing treatment apparatus as set forth in claim 1, further comprising:
another gas blow nozzle provided on the lower side of the carriage path of the substrate.

7. The substrate developing treatment apparatus as set forth in claim 1, further comprising:
an air supply unit for forming an air curtain between said substrate transfer unit and said developing treatment unit.

8. The substrate developing treatment apparatus as set forth in claim 7,
wherein said gas blow nozzle also serves as said air supply unit.

9. The substrate developing treatment apparatus as set forth in claim 1,
wherein said treatment container is formed with an air supply port on said substrate transfer unit side and an exhaust port on said developing treatment unit side.

10. The substrate developing treatment apparatus as set forth in claim 1,
wherein said substrate transfer unit is provided with a support member for supporting the substrate, and
wherein said carrier mechanism grasps an outside surface of the substrate on said support member.

11. The substrate developing treatment apparatus as set forth in claim 1,
wherein said carrier mechanism comprises grasping members for grasping both side surfaces of the substrate in a direction perpendicular to a carriage direction of the substrate and moving members for supporting and moving said grasping members in the perpendicular direction, and
wherein elastic bodies lie between said grasping members and said moving members.

12. The substrate developing treatment apparatus as set forth in claim 11, further comprising:
fixed members fixedly provided on said moving members on the rear side of said grasping members located opposite to the substrate to be grasped,
wherein said fixed members and said grasping members are connected via said elastic bodies.

13. The substrate developing treatment apparatus as set forth in claim 11,
wherein an end surface of said grasping member coming into contact with the outside surface of the substrate is curved concavely inward from a lateral view.

14. A substrate developing treatment apparatus, comprising:
a substrate transfer unit into/from which a substrate is transferred from/to the outside of a treatment container and a developing treatment unit in which development of the substrate is performed, said substrate transfer unit and said developing treatment unit being arranged side by side in said treatment container;
a carrier mechanism provided in said treatment container for carrying the substrate while grasping an outside surface of the substrate from both sides, between said substrate transfer unit and said developing treatment unit; and
a developing solution supply nozzle for supplying a developing solution onto the substrate, a cleaning solution supply nozzle for supplying a cleaning solution onto the substrate, and a gas blow nozzle for blowing a gas to the substrate, said developing solution supply nozzle, said cleaning solution supply nozzle, and said gas blow nozzle being provided between said substrate transfer unit and said developing treatment unit and above a carriage path along which the substrate is carried by said carrier mechanism.

15. The substrate developing treatment apparatus as set forth in claim 14, further comprising:
a nozzle holding unit provided between said substrate transfer unit and said developing treatment unit and above the carriage path of the substrate,
wherein, in said nozzle holding unit, said gas blow nozzle, said cleaning solution supply nozzle, and said developing solution supply nozzle are arranged side by side in this order from said substrate transfer unit toward said developing treatment unit.

16. The substrate developing treatment apparatus as set forth in claim 14, further comprising:
another cleaning solution supply nozzle provided below the carriage path of the substrate.

17. The substrate developing treatment apparatus as set forth in claim 16, further comprising:
another gas blow nozzle provided below the carriage path of the substrate.

18. The substrate developing treatment apparatus as set forth in claim 17, further comprising:
a nozzle holding unit provided between said substrate transfer unit and said developing treatment unit and below the carriage path of the substrate,
wherein, in said nozzle holding unit below the carriage path of the substrate, said gas blow nozzle and said cleaning solution supply nozzle are arranged side by side in this order from said substrate transfer unit toward said developing treatment unit.

19. A developing treatment method of performing developing treatment for a substrate using a developing treatment apparatus, the developing treatment apparatus comprising:
a substrate transfer unit into/from which a substrate is transferred from/to the outside of a treatment container and a developing treatment unit in which development of the substrate is performed, the substrate transfer unit and the developing treatment unit being arranged side by side in the treatment container;
a carrier mechanism provided in the treatment container for carrying the substrate while grasping an outside surface of the substrate from both sides, between the substrate transfer unit and the developing treatment unit; and
a developing solution supply nozzle for supplying a developing solution onto the substrate, a cleaning solution supply nozzle for supplying a cleaning solution onto the substrate, and a gas blow nozzle for blowing a gas to the substrate, the developing solution supply nozzle, the cleaning solution supply nozzle, and the gas blow nozzle being provided between the substrate transfer unit and the developing treatment unit and above a carriage path along which the substrate is carried by the carrier mechanism, said method comprising the steps of:
grasping the outside surface of the substrate in the substrate transfer unit by the carrier mechanism;
carrying the substrate in the substrate transfer unit by the carrier mechanism to the developing treatment unit while discharging the developing solution from the developing solution supply nozzle to form a liquid film of the developing solution on the substrate;
performing static development for the substrate in the developing treatment unit;
reciprocating the substrate by the carrier mechanism between the developing treatment unit and the substrate transfer unit while discharging the cleaning solution from the cleaning solution supply nozzle to form a liquid film of the cleaning solution on the substrate; and
carrying the substrate in the developing treatment unit by the carrier mechanism to the substrate transfer unit while blowing the gas from the gas blow nozzle to remove the cleaning solution on the substrate.

20. A developing treatment apparatus including a developing solution supply nozzle disposed above a substrate in which said developing solution supply nozzle and the substrate are relatively horizontally moved while said developing solution supply nozzle is discharging a developing solution to supply the developing solution to the substrate, said apparatus comprising:
a substrate carrier mechanism for carrying the substrate in a horizontal direction to pass the substrate under a discharge port of said developing solution supply nozzle, said substrate carrier mechanism carries the substrate while grasping an outside surface of the substrate from both sides; and
a mesh plate capable of lying between said developing solution supply nozzle and the substrate and allowing the developing solution to pass therethrough,
wherein said mesh plate is capable of approaching the substrate such that said mesh plate comes into contact with the developing solution supplied on the substrate, and
wherein at least a surface of said mesh plate on the substrate side has been subjected to hydrophilic treatment.

21. The developing treatment apparatus as set forth in claim 20,
wherein at least the surface of said mesh plate on the substrate side has been hydrophilized so that a contact angle thereof with respect to the developing solution is 10° or less.

22. The developing treatment apparatus as set forth in claim 20,
wherein a lower surface of said developing solution supply nozzle is formed with a discharge port in a predetermined direction over a distance longer than a dimension of the substrate in one direction,
said apparatus further comprising a substrate carrier mechanism for carrying the substrate in a horizontal direction perpendicular to the predetermined direction to pass the substrate under the discharge port of said developing solution supply nozzle,
wherein said mesh plate has one end portion located below the discharge port of said developing solution supply nozzle, and said mesh plate is formed starting from the position below the discharge port toward the substrate passage direction and formed to cover all or a part of an upper surface of the substrate which has passed under the discharge port.

23. The developing treatment apparatus as set forth in claim 22, further comprising:
a cleaning solution supply nozzle for supplying a cleaning solution to the substrate, provided adjacent to said mesh plate on the substrate passage direction side of said mesh plate,
wherein said substrate carrier mechanism is capable of passing the substrate under said mesh plate toward the substrate passage direction and passing the substrate under said cleaning solution supply nozzle.

24. The developing treatment apparatus as set forth in claim 23,
wherein said cleaning solution supply nozzle has a discharge port for the cleaning solution on a lower surface thereof, and
wherein said substrate carrier mechanism carries the substrate such that a period from the passage of the substrate under the discharge port of said developing solution supply nozzle to the passage of the substrate under the discharge port of said cleaning solution supply nozzle is a predetermined developing time.

25. The developing treatment apparatus as set forth in claim 20,
wherein said mesh plate is sized to be able to cover the entire upper surface of the substrate, wherein a lower surface of said developing solution supply nozzle is formed with a discharge port in a predetermined direction over a distance longer than a dimension of the substrate in one direction, wherein the substrate carrier mechanism carries the substrate in a horizontal direction perpendicular to the predetermined direction to pass the substrate under the discharge port of said developing solution supply nozzle, said apparatus further comprising:

a mesh plate carrier mechanism for carrying said mesh plate while said mesh plate is covering the upper surface of the substrate, in the same direction as that of the substrate to pass said mesh plate under the discharge port of said developing solution supply nozzle.

26. The developing treatment apparatus as set forth in claim 22, further comprising:

a cleaning solution supply nozzle for supplying a cleaning solution onto the substrate through said mesh plate from above said mesh plate.

27. The developing treatment apparatus as set forth in claim 25, further comprising:

a cleaning solution supply nozzle for supplying a cleaning solution onto the substrate through said mesh plate from above said mesh plate.

28. The developing treatment apparatus as set forth in claim 22, further comprising:

a substrate transfer unit into/from which the substrate is transferred from/to the outside of a treatment container and a developing treatment unit in which development of the substrate is performed, said substrate transfer unit and said developing treatment unit being arranged side by side in said treatment container, wherein said developing solution supply nozzle and a gas blow nozzle for blowing a gas to the substrate are arranged between said substrate transfer unit and said developing treatment unit, and wherein said substrate carrier mechanism carries the substrate while between said substrate transfer unit and said developing treatment unit.

* * * * *